United States Patent
No et al.

(10) Patent No.: US 11,637,170 B2
(45) Date of Patent: Apr. 25, 2023

(54) DISPLAY DEVICE HAVING GATE DRIVING CIRCUIT STAGES LOCATED BETWEEN PIXELS IN THE DISPLAY AREA

(71) Applicant: Samsung Display Co., Ltd., Yongin-si (KR)

(72) Inventors: Sang Yong No, Yongin-si (KR); Tae Ho Kang, Yongin-si (KR); Kwi Hyun Kim, Yongin-si (KR); Hwa Rang Lee, Yongin-si (KR); Ji Yeon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/445,266

(22) Filed: Aug. 17, 2021

(65) Prior Publication Data

US 2022/0190093 A1 Jun. 16, 2022

(30) Foreign Application Priority Data

Dec. 15, 2020 (KR) ........................ 10-2020-0175869

(51) Int. Cl.
*H01L 27/32* (2006.01)
*G09G 3/3266* (2016.01)
*G09G 3/3275* (2016.01)
*G09G 3/3225* (2016.01)

(52) U.S. Cl.
CPC ....... *H01L 27/3276* (2013.01); *G09G 3/3225* (2013.01); *G09G 3/3266* (2013.01); *G09G 3/3275* (2013.01); *H01L 27/326* (2013.01); *G09G 2310/0278* (2013.01)

(58) Field of Classification Search
CPC .................................................. H01L 27/3276
USPC ........................................................ 257/40
See application file for complete search history.

(56) References Cited

U.S. PATENT DOCUMENTS

| 10,839,763 B2 | 11/2020 | Shin et al. | |
| 2016/0189598 A1* | 6/2016 | Takeuchi | G09G 3/3677 345/95 |
| 2021/0201814 A1* | 7/2021 | Choi | G09G 3/3266 |

FOREIGN PATENT DOCUMENTS

| KR | 10-1157425 B1 | 6/2012 |
| KR | 10-2018-0028098 A | 3/2018 |

* cited by examiner

*Primary Examiner* — Long D Pham
(74) *Attorney, Agent, or Firm* — Lewis Roca Rothgerber Christie LLP

(57) ABSTRACT

A display device, includes: pixels at a display area; gate lines at the display area, and connected to the pixels; carry clock lines and scan clock lines at the display area; and a gate driving circuit distributedly located at the display area, and connected to the carry clock lines, the scan clock lines, and the gate lines. The gate driving circuit includes a plurality of stages, each of the stages to output, as a carry signal, a carry clock signal supplied through a corresponding carry clock line from among the carry clock lines, and to output, as a scan signal, a scan clock signal supplied through a corresponding scan clock line from among the scan clock lines. The corresponding carry clock line and the corresponding scan clock line corresponding to one stage from among the stages are spaced from each other with at least one of the pixels interposed therebetween.

20 Claims, 16 Drawing Sheets

FIG. 1
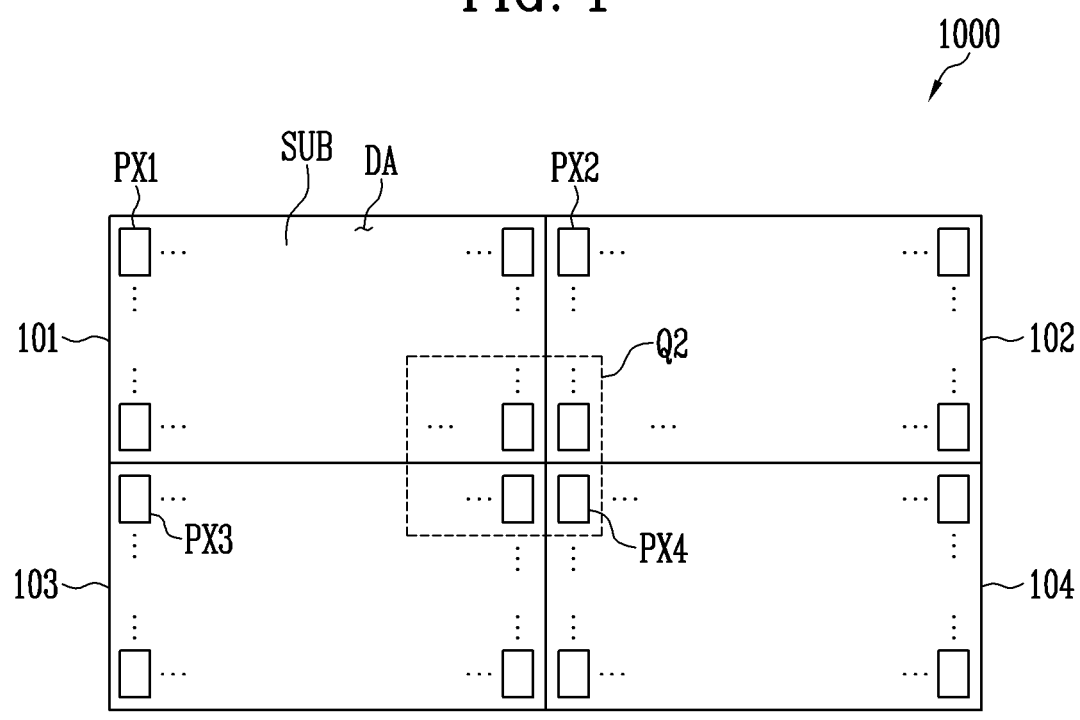
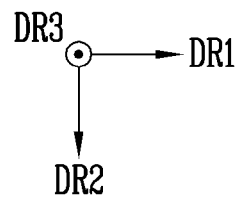

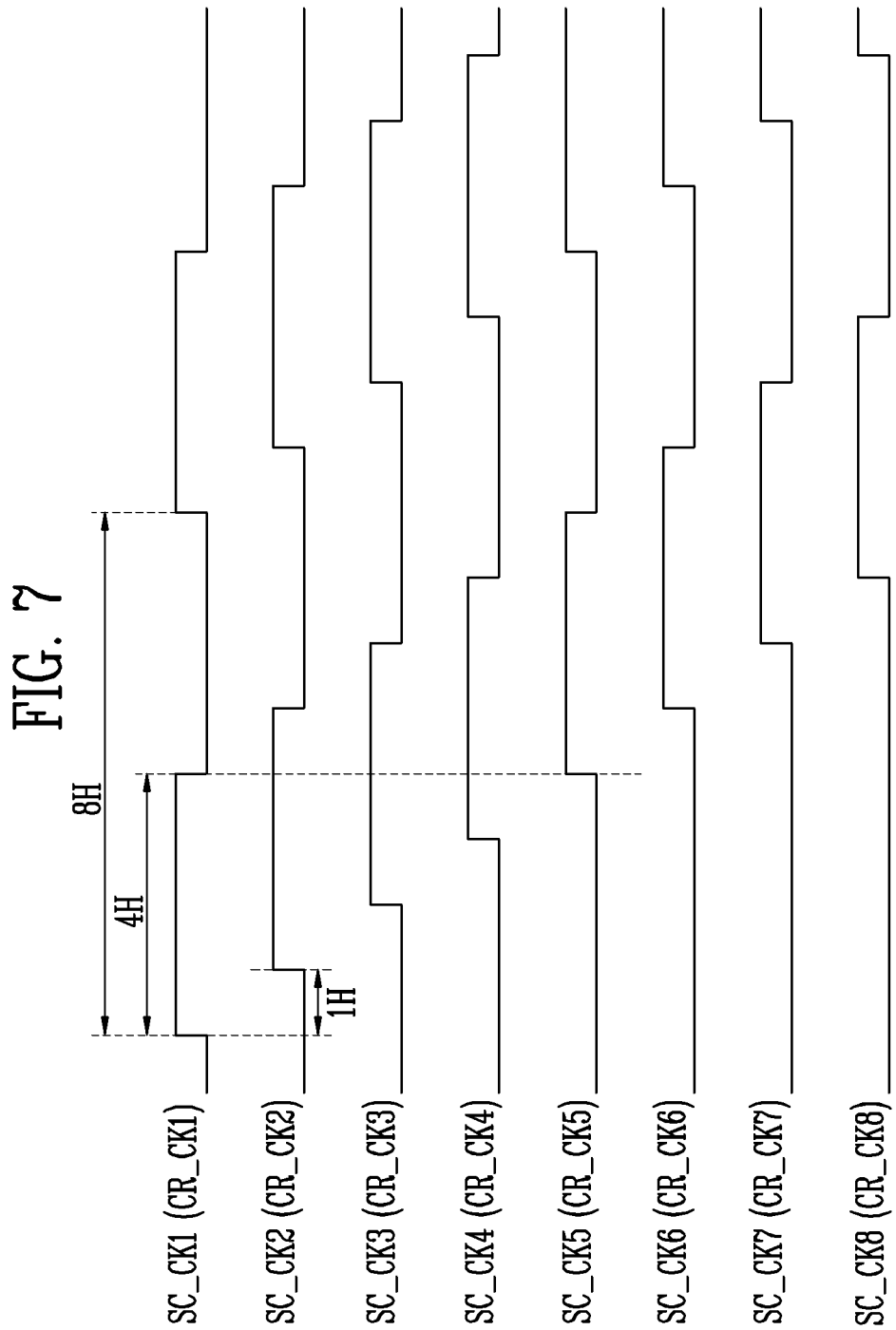

CLKS: CR_CLK

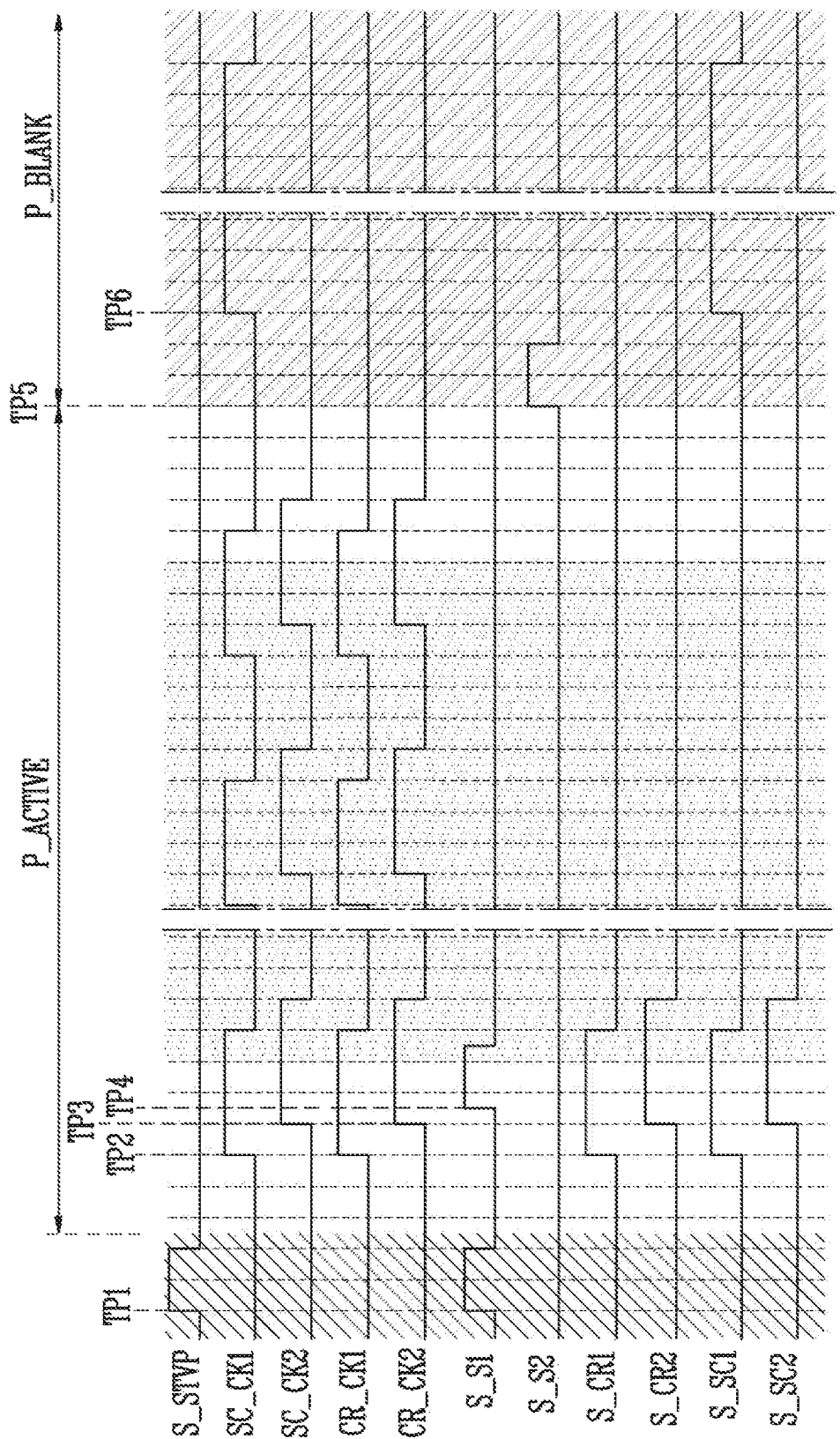

DISPLAY DEVICE HAVING GATE DRIVING CIRCUIT STAGES LOCATED BETWEEN PIXELS IN THE DISPLAY AREA

CROSS-REFERENCE TO RELATED APPLICATION

This application claims priority to and the benefit of Korean patent application No. 10-2020-0175869, filed on Dec. 15, 2020, the entire disclosure of which is incorporated by reference herein.

BACKGROUND

1. Field

Aspects of embodiments of the present disclosure relate to a display device.

2. Description of Related Art

With increasing interest in an information display, and an increase in demand for use of portable information media, demand for display devices has markedly increased, and commercialization thereof is in progress.

SUMMARY

One or more embodiments of the present disclosure are directed to a display device, and more particularly, to a display device in which a non-display area is reduced or minimized.

According to one or more embodiments of the present disclosure, a display device includes: a substrate including a display area; pixels at the display area; gate lines at the display area, and connected to the pixels; carry clock lines and scan clock lines at the display area; and a gate driving circuit distributedly located at the display area, and connected to the carry clock lines, the scan clock lines, and the gate lines. The gate driving circuit includes a plurality of stages, each of the stages being configured to output, as a carry signal, a carry clock signal supplied through a corresponding carry clock line from among the carry clock lines in response to a preceding carry signal supplied from a preceding stage, and to output to a corresponding gate line from among the gate lines, as a scan signal, a scan clock signal supplied through a corresponding scan clock line from among the scan clock lines The corresponding carry clock line and the corresponding scan clock line corresponding to one stage from among the stages are spaced from each other with at least one of the pixels interposed therebetween.

In an embodiment, the corresponding scan clock line may be located at a first side of the one stage, and the corresponding carry clock line may be located at a second side opposite the first side of the one stage.

In an embodiment, the one stage may include a plurality of transistors, and the transistors may be distributedly located at a unit area corresponding to at least two gate lines from among the gate lines.

In an embodiment, the carry clock line may be adjacent to a preceding carry clock line from among the carry clock lines between the stages, and a preceding carry clock signal having a phase difference of 180 degrees from the carry clock signal may be applied to the preceding carry clock line. The scan clock line may be adjacent to a preceding scan clock line from among the scan clock lines between the stages, and a preceding scan clock signal having a phase difference of 180 degrees from the scan clock signal may be applied to the preceding scan clock line.

In an embodiment, the one stage may include: a node control circuit configured to control a first node voltage of a first node in response to the preceding carry signal; a first output circuit configured to output, as the carry signal, the carry clock signal in response to the first node voltage; and a second output circuit configured to output, as the scan signal, the scan clock signal in response to the first node voltage. The first output circuit may be adjacent to the second side of the one stage, the second output circuit may be adjacent to the side of the one stage, and the node control circuit may be between the first output circuit and the second output circuit.

In an embodiment, the display device may further include: a first power supply line at the display area, and connected to the first output circuit; and a second power supply line at the display area, and connected to the second output circuit, and the first power supply line and the second power supply line may be located between the carry clock line and the scan clock line with respect to the one stage.

In an embodiment, the gate driving circuit may further include a dummy stage; each of the stages may be configured to be initialized in response to a subsequent carry signal supplied from a subsequent stage, and the subsequent stage may be configured to shift the carry signal to output the subsequent carry signal; a last stage from among the stages may be configured to receive the subsequent carry signal from the dummy stage; and the dummy stage may be spaced farther from an edge of the display area compared to the last stage.

In an embodiment, the dummy stage may be located between last two stages from among the stages.

In an embodiment, the gate lines may extend in a first direction; the carry clock lines and the scan clock lines may extend in a second direction; and the gate lines may cross the carry clock lines and the scan clock lines at the display area.

In an embodiment, the stages may be divided into sub-blocks along the first direction with respect to the carry clock lines; and a part of the stages may be located along the first direction.

In an embodiment, two carry clock lines to which two carry clock signals having a phase difference of 180 degrees are applied from among the carry clock lines may be arranged in a pair, and stages that are connected to the pair of carry clock lines from among the stages may be included in one sub-block.

In an embodiment, at least a part of the carry clock lines may be connected to first connection lines extending in the first direction between the stages.

In an embodiment, the display device may further include power supply lines at the display area, and connected to the stages, and the power supply lines may be located between the carry clock line and the scan clock line with respect to each of the stages. The power supply lines may be connected to second connection lines extending in the first direction between the stages, and each of the second connection lines may be more adjacent to the pixels compared to the first connection lines.

In an embodiment, the gate driving circuit may include three or more blocks; and each of the blocks may include at least two stages from among the plurality of stages.

According to one or more embodiments of the present disclosure, a display device includes: a substrate including a display area; pixels at the display area; gate lines at the display area, and connected to the pixels; carry clock lines and scan clock lines at the display area; and a gate driving circuit distributedly located at the display area, and connected to the carry clock lines, the scan clock lines, and the gate lines. The gate driving circuit includes a plurality of stages, each of the stages being configured to output, as a carry signal, a carry clock signal supplied through a corresponding carry clock line from among the carry clock lines in response to a preceding carry signal supplied from a preceding stage, and to output to a corresponding gate line from among the gate lines, as a scan signal, a scan clock signal supplied through a corresponding scan clock line from among the scan clock lines. The gate driving circuit further includes a dummy stage. Each of the stages is configured to be initialized in response to a subsequent carry signal supplied from a subsequent stage, and the subsequent stage is configured to shift the carry signal to output the subsequent carry signal. A last stage from among the stages is configured to receive the subsequent carry signal from the dummy stage, and the dummy stage is spaced farther from an edge of the display area compared to the last stage.

In an embodiment, the dummy stage may be located between last two stages from among the stages.

In an embodiment, the gate lines may extend in a first direction, and the carry clock lines and the scan clock lines may extend in a second direction; the gate lines may cross the carry clock lines and the scan clock lines at the display area; and a part of the stages may be located along the first direction.

In an embodiment, two carry clock lines to which two carry clock signals having a phase difference of 180 degrees are applied from among the carry clock lines may form a pair, and the pair of carry clock lines may be located between two adjacent stages from among the stages.

In an embodiment, at least a part of the carry clock lines may be connected to first connection lines extending in the first direction between the stages.

In an embodiment, the display device may further include power supply lines at the display area, and connected to the stages. The power supply lines may be located between the carry clock line and the scan clock line with respect to each of the stages, and the power supply lines may be connected to second connection lines extending in the first direction between the stages. Each of the second connection lines may be more adjacent to the pixels compared to the first connection lines.

BRIEF DESCRIPTION OF THE DRAWINGS

The above and other aspects and features of the present disclosure will be more clearly understood from the following detailed description of the illustrative, non-limiting example embodiments with reference to the accompanying drawings.

FIG. 1 is a plan view illustrating a display device in accordance with an embodiment of the present disclosure.

FIG. 7 is a waveform diagram illustrating an example of clock signals used in the gate driving circuit of FIG. 6.

FIG. 8E is a waveform diagram illustrating the operation of the gate driving circuit of FIG. 6.

DETAILED DESCRIPTION

Figure 2:
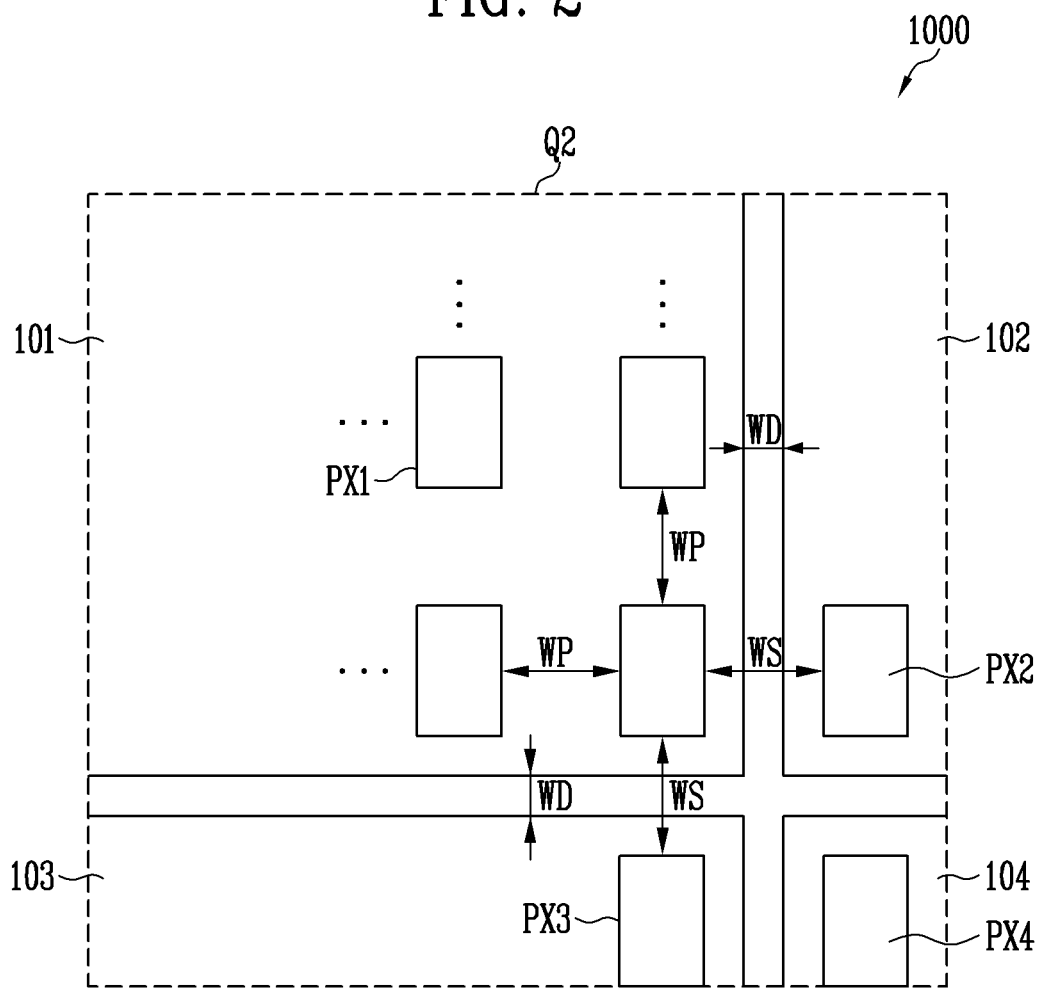
FIG. 2 is an enlarged plan view of the region Q2 of FIG. 1.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction DR1, the second direction DR2, and the third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "coupled to," or "connected to" another element or layer, it can be directly on, coupled to, or connected to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device in accordance with an embodiment of the present disclosure. FIG. 2 is an enlarged plan view of the region Q2 of FIG. 1.

Referring to FIGS. 1 and 2, a display device 1000 (e.g., a tiled display device) may display an image based on image data. The display device 1000 may display an image in a third direction DR3.

The display device 1000 may include a plurality of display panels 100 (e.g., sub-display devices).

The display device 1000 may be formed by connecting two or more display panels 100 with one another. Although FIG. 1 illustrates that the plurality of display panels 100 are connected in a 2×2 arrangement, the arrangement and number of the display panels 100 included in the display device 1000 are not limited thereto.

In an embodiment of the present disclosure, the display panels 100 included in the display device 1000 may be mounted in a chassis while being in close contact with each other, or may be connected to one another through a separate coupling means.

In some embodiments, a buffer agent may be disposed between the display panels 100 to prevent or substantially prevent damage thereto due to a collision. However, the present disclosure is not limited thereto. For example, transparent tape or transparent resin may be disposed between the display panels 100 as a coupling means to connect the display panels 100 to one another.

At least a distance WD may be present between the display panels 100 by intervening such a coupling means and/or a buffer agent therebetween. When the distance WD between adjacent display panels 100 is larger than a distance WP between adjacent pixels PXL of the display panel 100 by a reference distance or more (e.g., by a predetermined reference or more), a boundary between the display panels 100 may be visually recognized, resulting in poor visibility.

In some embodiments, the display panels 100 may independently output different images from each other. In some embodiments, the display panels 100 may output one shared image with each other, for example, by dividing the image into multiple parts and then outputting the multiple parts.

In an embodiment, the display device 1000 may include a first display panel 101, a second display panel 102, a third display panel 103, and a fourth display panel 104. The display device 1000 may include a plurality of pixels PXL disposed in each of the display panels 100.

The first display panel 101 may include a plurality of pixels PX1 disposed at (e.g., in or on) a display area DA of a substrate SUB. The second display panel 102 may include a plurality of pixels PX2 disposed at (e.g., in or on) the display area DA of the substrate SUB. The third display panel 103 may include a plurality of pixels PX3 disposed at (e.g., in or on) the display area DA of the substrate SUB. The fourth display panel 104 may include a plurality of pixels PX4 disposed at (e.g., in or on) the display area DA of the substrate SUB. The pixels PXL will be described in more detail below with reference to FIGS. 3 to 5.

At (e.g., in or on) the display area DA of each of the display panels 100, gate lines and data lines connected to the pixels PXL, and drivers (e.g. a gate driving circuit) for driving the pixels PXL may be provided.

Furthermore, each of the display panels 100 may include a non-display area excluding the display area DA. The non-display area may be provided at (e.g., in or on) at least one side of the display area DA. The non-display area may be provided in a smaller area (e.g., in an extremely smaller area) compared to that of the display area DA. In an embodiment, the non-display area may not be provided.

In an embodiment, the distance WS between the pixels PXL located at (e.g., in or on) the outermost portions of different display panels 100 may be less than or equal to a distance WP between adjacent pixels PXL of one display panel 100. For example, the distance WS between a pixel PX1 disposed at (e.g., in or on) the outermost portion of the first display panel 101 and a pixel PX2 disposed at (e.g., in or on) the outermost portion of the second display panel 102 may be less than or equal to the distance WP between the adjacent pixels PX1 of the first display panel 101. For example, the distance WS between the pixel PX1 disposed at (e.g., in or on) the outermost portion of the first display panel 101 and a pixel PX3 disposed at (e.g., in or on) the outermost portion of the third display panel 103 may be less than or equal to the distance WP between the adjacent pixels PX1 of the first display panel 101. In an embodiment, the distances between the adjacent pixels PXL of the display device 1000 may be the same or substantially the same as each other.

In this case, a user may not recognize the display panels 100 of the display device 1000 as separate screens, and may recognize the display panels 100 as one screen.

To arrange the pixels PXL of the display device 1000 such that the distances between adjacent ones of the pixels PXL are equal or substantially equal to each other, or in other words, to minimize or reduce the non-display area that may exist at (e.g., in or on) the outermost portion of each of the display panels 100, the gate driving circuit configured to drive the pixels PXL may be distributedly (e.g., distributively) disposed at (e.g., in or on) the display area DA. An example arrangement of the gate driving circuit will be described in more detail below with reference to FIG. 9.

Figure 3:
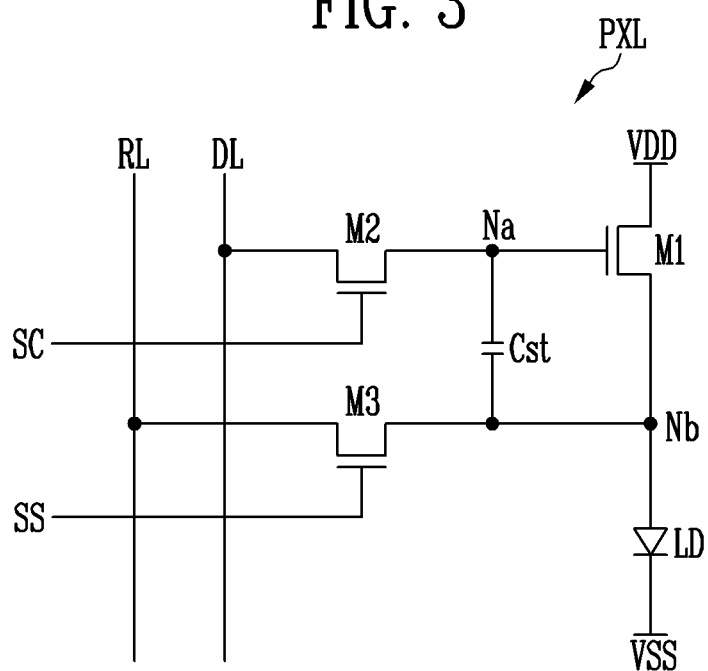
FIG. 3 is a circuit diagram illustrating an example of a pixel included in the display device of FIG. 1.
Figure 4:
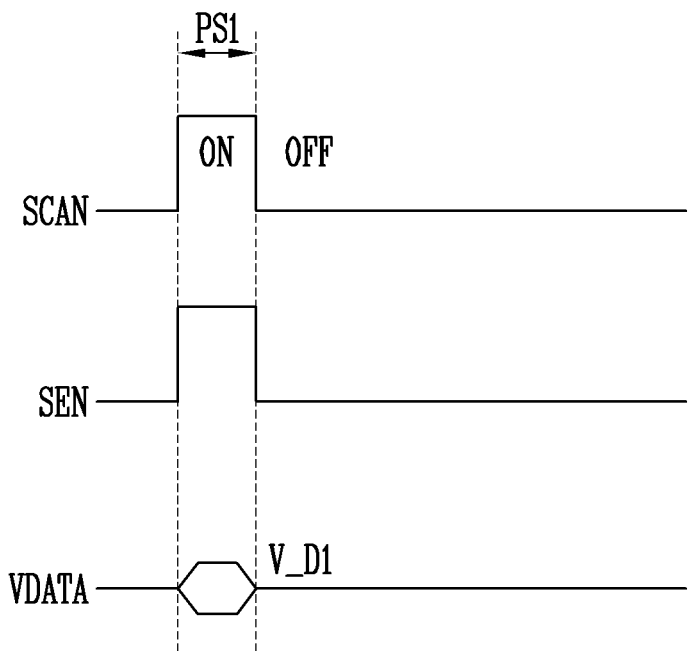
FIG. 4 is a waveform diagram illustrating an operation of the pixel of FIG. 3.

FIG. 3 is a circuit diagram illustrating an example of a pixel included in the display device of FIG. 1. FIG. 4 is a waveform diagram illustrating an operation of the pixel of FIG. 3.

Referring to FIG. 3, the pixel PXL may include first to third thin-film transistors M1, M2, and M3 (e.g., switching elements, transistors, and the like), a storage capacitor Cst, and a light emitting element LD. Each of the first to third thin-film transistors M1, M2, and M3 may be formed of an N-type transistor.

The first thin-film transistor M1 may include a gate electrode connected to a gate node Na, one electrode (e.g., a first electrode) connected to a first power line VDD, and another electrode (e.g., a second electrode) connected to a source node Nb. The first thin-film transistor M1 may be referred to as a driving transistor.

The second thin-film transistor M2 may include a gate electrode connected to a scan line SC (e.g., a first gate line), one electrode connected to a data line DL, and another electrode connected to the gate node Na. The second thin-film transistor M2 may be referred to as a switching transistor, a scan transistor, or the like. The scan line SC may be connected to a gate driving circuit, which will be described in more detail below with reference to FIG. 6. The data line DL may be connected to a data driver, which will be described in more detail below with reference to FIG. 9.

The third thin-film transistor M3 may include a gate electrode connected to a sensing scan line SS (e.g., a second gate line), one electrode connected to a sensing line RL, and another electrode connected to the source node Nb. The third thin-film transistor M3 may be referred to as an initialization transistor, a sensing transistor, or the like. The sensing scan line SS may be connected to a gate driving circuit, which will be described in more detail below with reference to FIG. 6. The sensing line RL may be connected to a data driver, which will be described in more detail below with reference to FIG. 9.

The storage capacitor Cst may include one electrode connected to the gate node Na, and another electrode connected to the source node Nb.

The light emitting element LD may include an anode connected to the source node Nb, and a cathode connected to a second power line VSS (e.g., a second power supply). The light emitting element LD may be a light emitting diode, which may include a material having an inorganic crystal structure and has a subminiature size, for example, corresponding to a size ranging from a nanometer scale to a micrometer scale. The light emitting element LD may be a subminiature light emitting diode manufactured by an etching method, or a subminiature light emitting diode manufactured by a growth method. However, the present disclosure is not limited thereto, and the light emitting element LD may be an organic light emitting diode.

A first power voltage may be supplied to the first power line VDD, and a second power voltage may be supplied to the second power line VSS. The first and second power voltages are voltages used for the operation of the pixel PXL. The first power voltage may have a voltage level higher than that of the second power voltage.

Referring to FIG. 4, during a first sub-period PS1, a scan signal SCAN (e.g., a first scan pulse) having a turn-on voltage level may be applied to the scan line SC, and a sensing scan signal SEN (e.g., a first sensing scan pulse) having a turn-on voltage level may be applied to the sensing scan line SS. Furthermore, a data signal VDATA corresponding to a grayscale value (e.g., a predetermined or specific grayscale value) may be applied to the data line DL. For example, the data signal VDATA may have a first valid data voltage V_D1.

In this case, in response to the scan signal SCAN, the second thin-film transistor M2 may be turned on, and the data signal VDATA may be supplied to the first electrode of the storage capacitor Cst. Furthermore, in response to the sensing scan signal SEN, the third thin-film transistor M3 may be turned on, and a first reference voltage applied to the sensing line RL may be supplied to the second electrode of the storage capacitor Cst. Thus, a voltage corresponding to a difference between the data signal VDATA and the first reference voltage may be stored in the storage capacitor Cst. Thereafter, when the second thin-film transistor M2 and the third thin-film transistor M3 are turned off, an amount of driving current flowing through the first thin-film transistor M1 may be determined in response to the voltage (e.g., the first valid data voltage V_D1) stored in the storage capacitor Cst, and the light emitting element LD may emit light having a luminance corresponding to the amount of driving current during periods other than the first sub-period PS1.

The scan signal SCAN and the sensing scan signal SEN shown in FIG. 4 may have the same waveform as each other. Thus, in an embodiment, the scan signal SCAN may be applied to the sensing scan line SS as the sensing scan signal SEN. In other words, in some embodiments, the sensing scan signal SEN may be omitted, and the scan signal SCAN may be applied to both the scan line SC and the sensing scan line SS.

Figure 5:
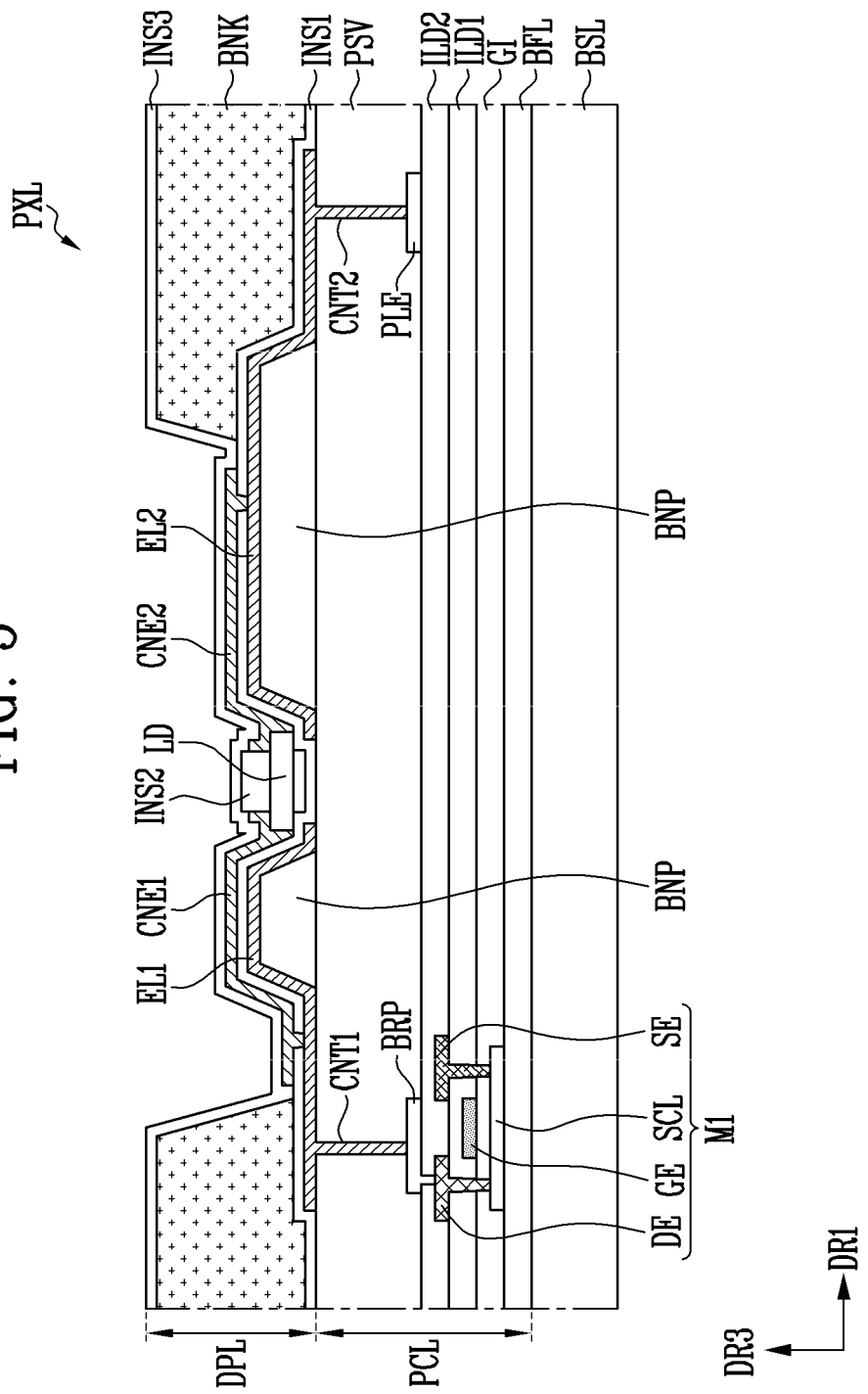
FIG. 5 is a cross-sectional view illustrating an example of the pixel of FIG. 3.

FIG. 5 is a cross-sectional view illustrating an example of the pixel of FIG. 3.

Referring to FIG. 5, the pixel PXL may include a base layer BSL, a pixel circuit component PCL, and a display element component DPL. For convenience in illustration, FIG. 5 illustrates the first thin-film transistor M1 from among the first to third thin-film transistors M1, M2, and M3 shown in FIG. 3.

The base layer BSL may be a rigid substrate or a soft (e.g., a flexible) substrate. According to an example, the base layer BSL may include a rigid material or a flexible material. The base layer BSL may correspond to the substrate SUB described above with reference to FIG. 1.

The pixel circuit component PCL may include a buffer layer BFL, the first thin-film transistor M1, a gate insulating layer GI, a first interlayer insulating layer ILD1, a second interlayer insulating layer ILD2, a bridge pattern BRP, a power supply line PLE, a first contactor CNT1, a second contactor CNT2, and a passivation layer PSV.

The buffer layer BFL may be located on the base layer BSL. The buffer layer BFL may prevent or substantially prevent impurities from being diffused from the outside. The buffer layer BFL may include at least one of various suitable materials, for example, such as silicon nitride ($SiN_x$), silicon oxide ($SiO_x$), silicon oxynitride ($SiO_xN_y$), and/or aluminum oxide ($AlO_x$).

The first thin-film transistor M1 may include a semiconductor layer SCL, a gate electrode GE, a source electrode SE, and a drain electrode DE.

The semiconductor layer SCL may be located on the buffer layer BFL. The semiconductor layer SCL may include an oxide semiconductor. However, the present disclosure is not limited thereto, and the semiconductor layer SCL may include polysilicon or amorphous silicon.

The semiconductor layer SCL may include a first contact region that is in contact with the source electrode SE, and a second contact region that is in contact with the drain electrode DE.

Each of the first and second contact regions may be a semiconductor pattern doped with impurities. A region between the first contact region and the second contact region may be a channel region. The channel region may be an intrinsic semiconductor pattern that is not doped (e.g., that is undoped) with impurities.

The gate insulating layer GI may be provided on the semiconductor layer SCL. The gate insulating layer GI may include an inorganic material. For example, the gate insulating layer GI may include at least one of silicon nitride ($SiN_x$), silicon oxide ($SiO_x$), silicon oxynitride ($SiO_xN_y$), and/or aluminum oxide ($AlO_x$). In an embodiment, the gate insulating layer GI may include an organic material.

The gate electrode GE may be located on the gate insulating layer GI. A position of the gate electrode GE may correspond to a position of the channel region of the semiconductor layer SCL. For example, the gate electrode GE may be disposed on the channel region of the semiconductor layer SCL with the gate insulating layer GI being interposed therebetween.

The first interlayer insulating layer ILD1 may be located on the gate electrode GE. Similar to the gate insulating layer GI, the first interlayer insulating layer ILD1 may include at least one of silicon nitride ($SiN_x$), silicon oxide ($SiO_x$), silicon oxynitride ($SiO_xN_y$), and/or aluminum oxide ($AlO_x$).

The source electrode SE and the drain electrode DE may be located on the first interlayer insulating layer ILD1. The source electrode SE may pass through (e.g., may penetrate) the gate insulting layer GI and the first interlayer insulating layer ILD1 to contact the first contact region of the semiconductor layer SCL, and the drain electrode DE may pass through (e.g., may penetrate) the gate insulting layer GI and the first interlayer insulating layer ILD1 to contact the second contact region of the semiconductor layer SCL.

The second interlayer insulating layer ILD2 may be located on the source electrode SE and the drain electrode DE. Similar to the first interlayer insulating layer ILD1 and the gate insulating layer GI, the second interlayer insulating layer ILD2 may include an inorganic material. The inorganic material may include one or more of the materials forming the first interlayer insulating layer ILD1 and the gate insulating layer GI, for example, such as at least one of silicon nitride ($SiN_x$), silicon oxide ($SiO_x$), silicon oxynitride ($SiO_xN_y$), and/or aluminum oxide ($AlO_x$). In an embodiment, the second interlayer insulating layer ILD2 may include an organic material.

The bridge pattern BRP may be disposed on the second interlayer insulating layer ILD2. The bridge pattern BRP may be electrically connected to the drain electrode DE through a contact hole passing through (e.g., penetrating) the second interlayer insulating layer ILD2.

The power supply line PLE may be disposed on the second interlayer insulating layer ILD2. The power supply line PLE may be the second power line VSS described above with reference to FIG. 3, and a second power may be supplied to the power supply line PLE.

The passivation layer PSV may be located on the second interlayer insulating layer ILD2. The passivation layer PSV may cover the bridge pattern BRP and the power supply line PLE.

The passivation layer PSV may be provided to include an organic insulating layer, an inorganic insulating layer, or an inorganic insulating layer and an organic insulating layer disposed on the inorganic insulating layer.

The first contactor CNT1 that is electrically connected to a region of the bridge pattern BRP, and the second contactor CNT2 that is electrically connected to a region of the power supply line PLE, may be provided at (e.g., in or on) the passivation layer PSV.

The display element component DPL may include a bank pattern BNP, a first electrode EL1, a second electrode EL2, a first insulating layer INS1, a light emitting element LD, a first contact electrode CNE1, a second contact electrode CNE2, a second insulating layer INS2, a bank BNK, and a third insulating layer INS3.

The bank pattern BNP may protrude upwards, and the first electrode EL1 and the second electrode EL2 may be arranged on the bank pattern BNP to form a reflective partition wall. The reflective partition wall may be formed to improve the light efficiency of the light emitting element LD.

The first electrode EL1 may be disposed on the passivation layer PSV. The first electrode EL1 may be a path to which the voltage of the first power line VDD described above with reference to FIG. 3 may be applied, and may be a path to which electrical information of the light emitting element LD may be provided.

The second electrode EL2 may be disposed on the passivation layer PSV. The second electrode EL2 may be a path to which the voltage of the second power line VSS described above with reference to FIG. 3 may be applied.

The first electrode EL1 and the second electrode EL2 may reflect light emitted from the light emitting element LD in a display direction, so that the light emitting efficiency of the light emitting element LD may be improved. In this case, the display direction may be the third direction DR3.

The first insulating layer INS1 may be located on the passivation layer PSV. Similar to the second interlayer insulating layer ILD2, the first insulating layer INS1 may include at least one of silicon nitride ($SiN_x$), silicon oxide ($SiO_x$), silicon oxynitride ($SiO_xN_y$), and aluminum oxide ($AlO_x$).

At least a portion of the first insulating layer INS1 may be disposed on the first electrode EL1, and/or the second electrode EL2 to stabilize an electrical connection and to reduce external influences.

The light emitting element LD may be located on the first insulating layer INS1. For example, the first insulating layer INS1 may have a groove (e.g., a predetermined groove), at least a portion of the light emitting element LD may be in contact with an end formed from the groove, and another portion of the light emitting element LD may be in contact with another end formed by the groove.

The light emitting element LD may be located on the first insulating layer INS1 between the first electrode EL1 and the second electrode EL2. The light emitting element LD may have a light emitting diode having a small size corresponding to a range from a nanometer scale to a micrometer scale.

The light emitting element LD may include a first semiconductor layer, a second semiconductor layer, an active layer, and an insulating layer. The first semiconductor layer may include a semiconductor layer of a suitable type (e.g., of a predetermined type), and the second semiconductor layer may include a semiconductor layer of a type that is different from that of the first semiconductor layer. For example, the first semiconductor layer may include an N-type semiconductor layer, and the second semiconductor layer may include a P-type semiconductor layer.

Each of the first and second semiconductor layers may include at least one semiconductor material from among InAlGaN, GaN, AlGaN, InGaN, AlN, and/or InN.

The active layer may be located between the first semiconductor layer and the second semiconductor layer. The active layer may have a single quantum well structure or a multiple quantum well structure.

When an electric field of a suitable voltage (e.g., a predetermined voltage) or higher is applied to both ends of the light emitting element LD, electron-hole pairs may be recombined in the active layer to emit light.

The second insulating layer INS2 may be located on the light emitting element LD. The second insulating layer INS2 may be formed to cover a region corresponding to the active layer of the light emitting element LD. The second insulating layer INS2 may include at least one of an organic material or an inorganic material.

According to an embodiment, at least a portion of the second insulating layer INS2 may be located on a rear surface of the light emitting element LD. The portion of the second insulating layer INS2 formed on the rear surface of the light emitting element LD may fill an empty gap between the first insulating layer INS1 and the light emitting element LD, while the second insulating layer INS2 is formed on the light emitting element LD.

The first contact electrode CNE1 and the second contact electrode CNE2 may be located on the first insulating layer INS1. The first contact electrode CNE1 and the second contact electrode CNE2 may be electrically connected to the first electrode EL1 and the second electrode EL2 through contact holes that are formed in the first insulating layer INS1.

The first contact electrode CNE1 and the second contact electrode CNE2 may include at least one of various suitable conductive materials including Indium Tin Oxide (ITO), Indium Zinc Oxide (IZO), and/or Indium Tin Zinc Oxide (ITZO).

An electric signal provided through the first electrode EL1 may be transmitted to the light emitting element LD through the first contact electrode CNE1. Accordingly, the light emitting element LD may emit light in response to the transmitted electric signal.

An electric signal provided through the second electrode EL2 may be transmitted to the light emitting element LD through the second contact electrode CNE2.

The bank BNK may be a structure defining an emission area of the pixel PXL. The emission area may refer to a region in which light is emitted from the light emitting element LD. For example, the bank BNK may be disposed at (e.g., in or on) a boundary region between adjacent pixels PXL to enclose the light emitting element LD of the pixel PXL.

The third insulating layer INS3 may be arranged on the bank BNK, the first contact electrode CNE1, the second contact electrode CNE2, and the second insulating layer INS2. The third insulating layer INS3 may include any one of an organic material and an inorganic material. The third insulating layer INS3 may protect the display element component DPL against external influences.

In an embodiment, a color conversion layer and/or a color filter may be disposed on the third insulating layer INS3.

The color conversion layer may include color conversion particles corresponding to desired colors (e.g., predetermined or specific colors). The color conversion layer may include color conversion particles that convert light of a first color emitted from the light emitting element LD disposed in the pixel PXL into light of a second color (or a specific color). For example, when the light emitting element LD in the pixel PXL emits blue light, the color conversion layer may include color conversion particles of quantum dots that convert light emitted from the light emitting element LD into red light or green light.

The color filter may selectively transmit light (e.g., light converted to a specific color) emitted from the color conversion layer. The color filter may include a red color filter, a green color filter, and a blue color filter.

Figure 6:
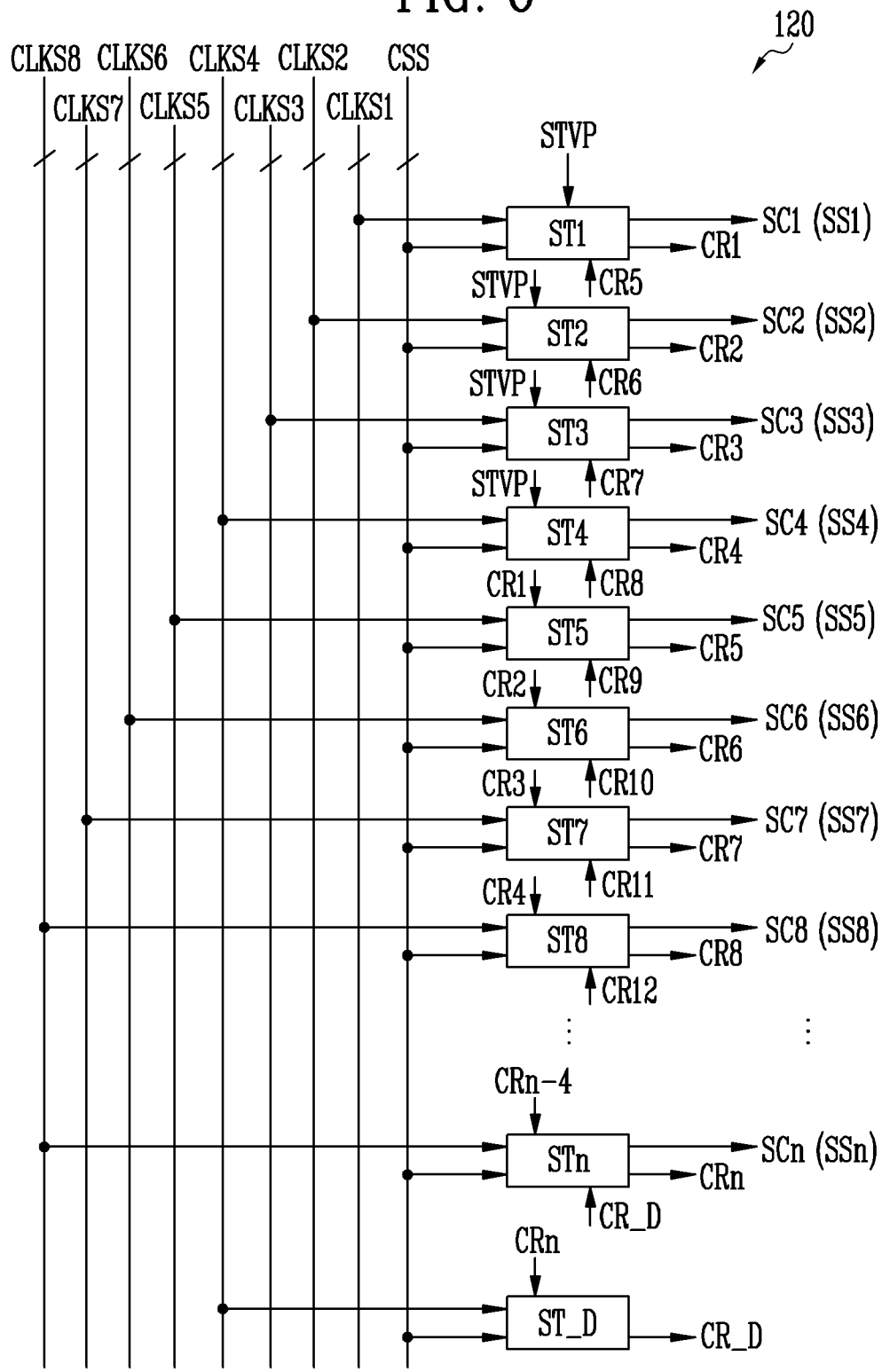
FIG. 6 is a block diagram illustrating a gate driving circuit for driving the pixel of FIG. 3.

FIG. 6 is a block diagram illustrating a gate driving circuit for driving the pixel of FIG. 3. FIG. 7 is a waveform diagram illustrating an example of clock signals used in the gate driving circuit of FIG. 6.

Referring to FIG. 6, the gate driving circuit 120 may include a plurality of stages ST1 to STn, where n is a positive integer.

The stages ST1 to STn may be connected to the scan lines SC1 to SCn (and/or the sensing scan lines SS1 to SSn) and the carry lines CR1 to CRn, respectively. One of the scan lines SC1 to SCn and one of the sensing scan lines SS1 to SSn may correspond to the scan line SC and the sensing scan line SS described above with reference to FIG. 3, respectively.

Furthermore, the stages ST1 to STn may be connected to corresponding clock lines from among a plurality of clock lines CLKS1 to CLKS8, and control lines CSS.

The clock lines CLKS1 to CLKS8 may include first clock lines CLKS1 to eighth clock lines CLKS8. Each of the first clock lines CLKS1 to the eighth clock lines CLKS8 may include a scan clock line and a carry clock line, which will be described in more detail below. However, the present disclosure is not limited thereto, and the number of the clock lines CLKS1 to CLKS8 may be variously modified. For example, the clock lines may include only the first clock lines CLKS1 to the sixth clock lines CLKS6, and may not include the seventh clock lines CLKS7 and the eighth clock lines CLKS8.

Clock signals applied to the first to eighth clock lines CLKS1 to CLKS8 may have different phases from one another. As illustrated in FIG. 7, first to eighth scan clock signals SC_CK1 to SC_CK8 (and first to eighth carry clock signals CR_CK1 to CR_CK8) applied to the first to eighth clock lines CLKS1 to CLKS8 may have the same or substantially the same cycle as one another, and may have a phase (e.g., a predetermined or specific phase) difference (e.g. a phase difference of a cycle/8). For example, each of the first to eighth scan clock signals SC_CK1 to SC_CK8 (and the first to eighth carry clock signals CR_CK1 to CR_CK8) may have a cycle of 8 horizontal periods 8H, and may have a logic low level (or a first voltage level, a turn-off voltage level, and the like) during four horizontal periods 4H. For example, the second scan clock signal SC_CK2 may have a phase delayed from the first scan clock signal SC_CK1 (e.g. a phase delayed by one horizontal period 1H). Some of the first to eighth scan clock signals SC_CK1 to SC_CK8 may have waveforms that are complementary to (or may have a phase difference of 180 degrees from) others (e.g., the rest) of the first to eighth scan clock signals SC_CK1 to SC_CK8. For example, in a period where the first scan clock signal SC_CK1 has the logic low level (or the first voltage level, turn-off voltage level, and the like), the fifth scan clock signal SC_CK5 may have a logic high level (or a second voltage level, turn-on voltage level, and the like). In a period where the fifth scan clock signal SC_CK5 has the logic low level, the first scan clock signal SC_CK1 may have a logic high level. In other words, the first scan clock signal SC_CK1 and the fifth scan clock signal SC_CK5 may have complementary waveforms with each other. Likewise, the second scan clock signal SC_CK2 and the sixth scan clock signal SC_CK6 may have complementary waveforms with each other, the third scan clock signal SC_CK3 and the seventh scan clock signal SC_CK7 may have complementary waveforms with each other, and the fourth scan clock signal SC_CK4 and the eighth scan clock signal SC_CK8 may have complementary waveforms with each other. As will be described in more detail below, the first to eighth clock lines CLKS1 to CLKS8 may be arranged at (e.g., in or on) the display area DA (e.g., see FIG. 1). In order to mitigate or prevent the effects (e.g. noise) of the clock signals (e.g. a pulse having the voltage level of about 25V to 30V) applied to the first to eighth clock lines CLKS1 to CLKS8 on the pixel PXL, the clock lines CLKS1 to CLKS8 to which the clock signals having complementary waveforms with each other are applied may be arranged in one pair.

Each of the first to eighth carry clock signals CR_CK1 to CR_CK8 may have the same or substantially the same waveform as that of the corresponding scan clock signal from among the first to eighth scan clock signals SC_CK1 to SC_CK8, or may have a waveform that is different from that of the corresponding scan clock signal.

The control lines CSS may include power supply lines to which driving powers used for the operation of each of the stages ST1 to STn are applied. In an embodiment, the control lines CSS may further include a reset control line for resetting the stages ST1 to STn.

The first stage ST1 may be connected to the first clock lines CLKS1, the second stage ST2 may be connected to the second clock lines CLKS2, the third stage ST3 may be connected to the third clock lines CLKS3, the fourth stage ST4 may be connected to the fourth clock lines CLKS4, the fifth stage ST5 may be connected to the fifth clock lines CLKS5, the sixth stage ST6 may be connected to the sixth clock lines CLKS6, the seventh stage ST7 may be connected to the seventh clock lines CLKS7, and the eighth stage ST8 may be connected to the eighth clock lines CLKS8. Stages that are subsequent to the eighth stage ST8 may be connected to corresponding clock lines from among the first to eighth clock lines CLKS1 to CLKS8, similar to those of the first to eighth stages ST1 to ST8. For example, the nth stage STn may be connected to the eighth clock lines CLKS8.

In one or more embodiments, each of the stages ST1 to STn may shift a start signal provided through a start signal line STVP, or a preceding carry signal provided from a preceding stage, using the clock signals to generate a corresponding carry signal and a corresponding scan signal (and/or a corresponding sensing scan signal).

For example, the first stage ST1 may shift the start signal to generate a first carry signal and a first scan signal (and a first sensing scan signal), using the first clock signals (e.g. the first carry clock signal CR_CK1 and the first scan clock signal SC_CK1) provided through the first clock line CLKS1. The first carry signal may be supplied to the first carry line CR1, and the first scan signal may be supplied to the first scan line SC1. The fifth stage ST5 may shift the first carry signal supplied from the first stage ST1 (e.g., a preceding stage of the fifth stage ST5) to generate a fifth carry signal and a fifth scan signal (and a fifth sensing scan signal), using the fifth clock signals (e.g. the fifth carry clock signal CR_CK5 and the fifth scan clock signal SC_CK5) provided through the fifth clock line CLKS5. The fifth carry signal may be supplied to the fifth carry line CR5, and the fifth scan signal may be supplied to the fifth scan line SC5. Similar to the fifth stage ST5, the sixth stage ST6 may shift the second carry signal (e.g., the second carry signal provided through the second carry line CR2) supplied from the second stage ST2 (e.g., a preceding stage of the sixth stage ST6) to generate a sixth carry signal and a sixth scan signal (and a sixth sensing scan signal), using the sixth clock signals (e.g. the sixth carry clock signal CR_CK6 and the sixth scan clock signal SC_CK6) provided through the sixth clock line CLKS6. The sixth carry signal may be supplied to the sixth carry line CR6, and the sixth scan signal may be supplied to the sixth scan line SC6. The n-th stage STn may shift an n−4-th carry signal (e.g., the n−4-th carry signal provided through an n−4-th carry line CRn−4) supplied from an n−4-th stage (e.g., a preceding stage of the n-th stage STn) to generate an n-th carry signal and an n-th scan signal (and an n-th sensing scan signal), using the eighth clock signals (e.g. the eighth carry clock signal CR_CK8 and the eighth scan clock signal SC_CK8) provided through the eighth clock line CLKS8. The n-th carry signal may be supplied to the n-th carry line CRn, and the n-th scan signal may be supplied to the n-th scan line SCn.

In an embodiment, each of the stages ST1 to STn may be initialized or reset in response to a subsequent carry signal supplied from a subsequent stage. Here, the subsequent stage may be a stage configured to receive a carry signal supplied from a corresponding stage as a preceding carry signal.

For example, the first stage ST1 may be initialized or reset in response to the fifth carry signal supplied from the fifth stage ST5 (e.g., a subsequent stage of the first stage ST1). The second stage ST2 may be initialized or reset in response to the sixth carry signal supplied from the sixth stage ST6 (e.g., a subsequent stage of the second stage ST2).

In order to initialize or reset the n-th stage STn or the like (e.g., a last stage), the gate driving circuit 120 may further include at least one dummy stage ST_D.

For example, as illustrated in FIG. 6, the dummy stage ST_D may be connected to the fourth clock lines CLKS4 and the control lines CSS, and may shift the n-th carry signal to generate a dummy carry signal using the fourth clock signals (e.g., the fourth carry clock signal CR_CK4 and the fourth scan clock signal SC_CK4) supplied through the fourth clock lines CLKS4. In some embodiments, the dummy stage ST_D may further generate a dummy scan signal (and a dummy sensing scan signal).

The dummy carry signal may be supplied to the n-th stage STn through the dummy carry line CR_D. The n-th stage STn may be initialized or reset in response to the dummy carry signal.

Figure 8A:
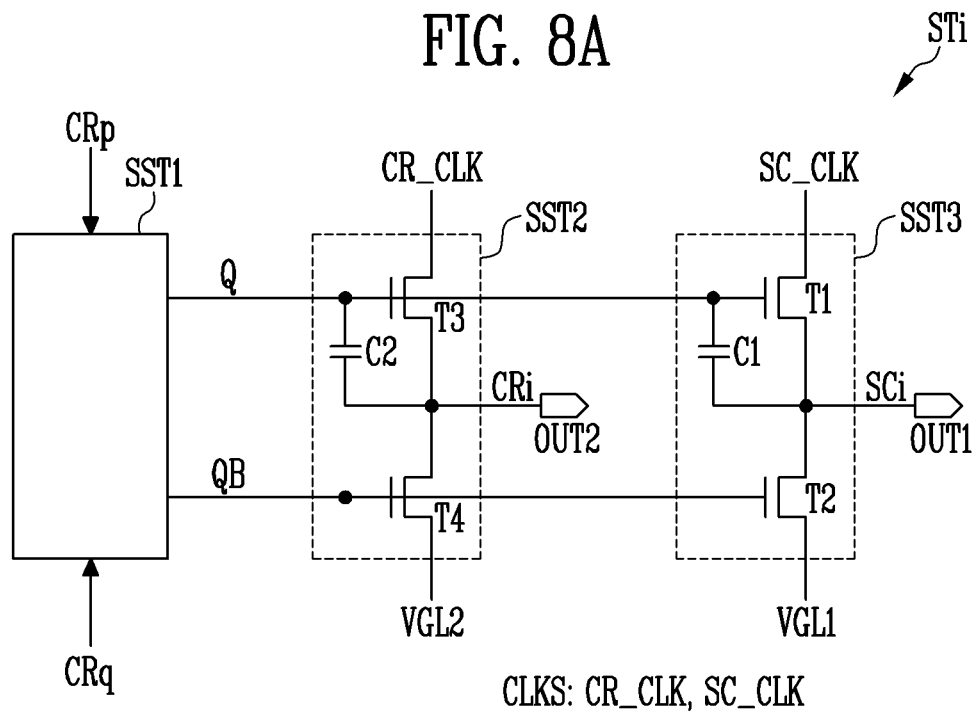
FIG. 8A is a diagram illustrating an example of a stage included in the gate driving circuit of FIG. 6.

FIG. 8A is a diagram illustrating an example of a stage included in the gate driving circuit of FIG. 6. Because the stages ST1 to STn (and the dummy stage ST_D) shown in FIG. 6 may be the same or substantially the same as (or similar to) each other, each of the stages ST1 to STn (and the dummy stage ST_D) may have a structure that is the same or substantially the same as (or similar to) a stage STi (where i is a positive integer less than or equal to n) shown in FIG. 8A, and thus, redundant description thereof may not be repeated.

Referring to FIG. 8A, the stage STi may include a node control circuit SST1, a first output circuit SST2, and a second output circuit SST3. The clock lines CLKS may include a carry clock line CR_CLK and a scan clock line SC_CLK. The clock lines CLKS may correspond to any one of the first to eighth clock lines CLKS1 to CLKS8 described above with reference to FIG. 6. A corresponding carry clock signal from among the first to eighth carry clock signals CR_CK1 to CR_CK8, and a corresponding scan clock signal from among the first to eighth scan clock signals SC_CK1 to SC_CK8, which are described above with reference to FIG. 7, may be applied to the carry clock line CR_CLK and the scan clock line SC_CLK, respectively.

The node control circuit SST1 may control a node voltage (e.g., a first node voltage) of a first node Q and a node voltage (e.g., a second node voltage) of a second node QB based on a preceding carry signal provided through a preceding carry line CRp (where p is a positive integer) of a preceding stage (or a start signal provided through the start signal line STVP). For example, when the preceding carry signal has a logic low level (or a turn-off voltage level), the node control circuit SST1 may control the second node QB so that the second node voltage of the second node QB has a logic high level (or a turn-on voltage level), and may control the first node Q so that the first node voltage of the first node Q is maintained or substantially maintained at the logic low level. For example, when the preceding carry signal has the logic high level, the node control circuit SST1 may control the first node Q so that the first node voltage of the first node Q has the logic high level, and may control the second node QB so that the second node voltage of the second node QB is maintained or substantially maintained at the logic low level.

In an embodiment, the node control circuit SST1 may initialize the node voltage (e.g., the first node voltage) of the first node Q based on a subsequent carry signal (or a dummy carry signal) provided through a subsequent carry line CRq (where q is a positive integer) of a subsequent stage. The node control circuit SST1 may initialize the node voltage of the first node Q using the subsequent carry signal, so that the stage STi outputs the carry signal and the scan signal, each having the logic high level in a corresponding horizontal period, and the stage STi does not output the carry signal and the scan signal, each having the logic high level (e.g., outputs the carry signal and the scan signal each having the logic low level) after the corresponding horizontal period.

In some embodiments, the node control circuit SST1 may control the node voltage (e.g., the first node voltage) of the first node Q and the node voltage (e.g., the second node voltage) of the second node QB based on a separate reset signal supplied from an external device.

The first output circuit SST2 may output, as a carry signal, a carry clock signal applied to the carry clock line CR_CLK in response to the first node voltage of the first node Q, through a second output terminal OUT2 (or a carry line CRi). The first output circuit SST2 may make the carry signal be full-down or maintained or substantially maintained at the second logic low level (or the second low voltage applied to the second low voltage line VGL2 (or the second power supply line)), in response to the second node voltage of the second node QB. The first output circuit SST2 may include a third transistor T3 and a fourth transistor T4. The third transistor T3 may include a first electrode connected to the carry clock line CR_CLK, a second electrode connected to the second output terminal OUT2, and a gate electrode connected to the first node Q. The fourth transistor T4 may include a first electrode connected to the second output terminal OUT2, a second electrode connected to the second low voltage line VGL2, and a gate electrode connected to the second node QB. The first output circuit SST2 may further include a second capacitor C2 connected between the gate electrode of the third transistor T3 and the second output terminal OUT2 to boost the carry signal of the logic high level.

The second output circuit SST3 may output, as a scan signal, a scan clock signal supplied through the scan clock line SC_CLK in response to the first node voltage of the first node Q, to the first output terminal OUT1 (or scan line SCi). The second output circuit SST3 may make the scan signal be full-down or maintained or substantially maintained at the first logic low level (or the first low voltage applied to the first low voltage line VGL1 (or the first power supply line)), in response to the second node voltage of the second node QB. The second output circuit SST3 may include a first transistor T1 and a second transistor T2. The first transistor T1 may include a first electrode connected to the scan clock line SC_CLK, a second electrode connected to the first output terminal OUT1, and a gate electrode connected to the first node Q. The second transistor T2 may include a first electrode connected to the first output terminal OUT1, a second electrode connected to the first low voltage line VGL1, and a gate electrode connected to the second node QB. Furthermore, the second output circuit SST3 may further include a first capacitor C1 connected between the gate electrode of the first transistor T1 and the first output terminal OUT1 to boost the scan signal of the logic high level.

Because the waveform of the scan signal and the waveform of the carry signal may be different from each other, the scan clock line SC_CLK that is distinguished from the carry clock line CR_CLK may be used, and the second output circuit SST3 that is distinguished from the first output circuit SST2 may be provided at (e.g., in or on) the stage STi. In order to prevent or substantially prevent interference between the output (e.g., the carry signal) of the first output circuit SST2 and the output (e.g., the scan signal) of the second output circuit SST3, the first low voltage line VGL1 and the second low voltage line VGL2 may be used.

Although FIG. 8A illustrates that the stage STi includes the first output circuit SST2 configured to output the carry signal, and the second output circuit SST3 configured to output the scan signal, the present disclosure is not limited thereto. For example, the stage STi may further include a third output circuit configured to output a sensing scan signal independently from the scan signal. The third output circuit may be implemented in the same or substantially the same manner as that of the second output circuit SST3.

Figure 8B:
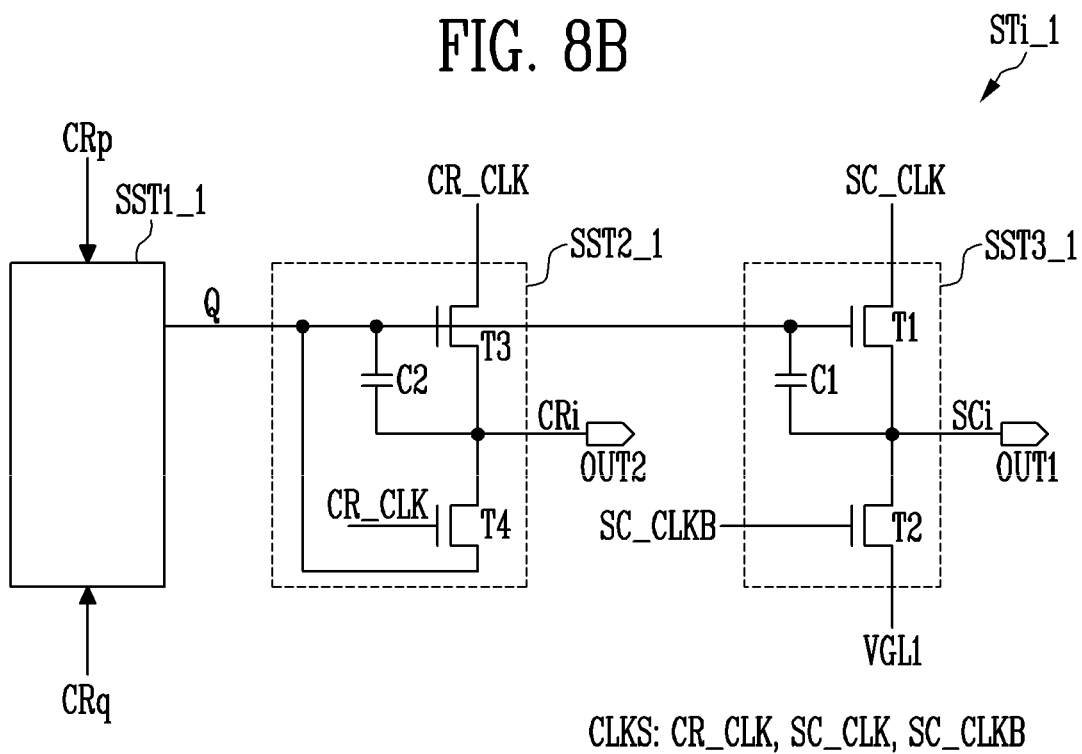
FIG. 8B is a diagram illustrating an example of a stage included in the gate driving circuit of FIG. 6.

FIG. 8B is a diagram illustrating an example of a stage included in the gate driving circuit of FIG. 6. FIG. 8B illustrates a diagram corresponding to the stage STi of FIG. 8A according to another embodiment.

Referring to FIGS. 8A and 8B, the stage STi_1 may include a node control circuit SST1_1, a first output circuit SST2_1, and a second output circuit SST3_1. Because the node control circuit SST1_1, the first output circuit SST2_1, and the second output circuit SST3_1 may be the same or substantially the same as (or similar to) the node control circuit SST1, the first output circuit SST2, and the second output circuit SST3 described with reference to FIG. 8A, respectively, redundant description thereof may not be repeated.

The first output circuit SST2_1 may include a third transistor T3, a fourth transistor T4, and a second capacitor C2. The fourth transistor T4 may include a first electrode connected to the second output terminal OUT2, a second electrode connected to the first node Q, and a gate electrode connected to the carry clock line CR_CLK. The fourth transistor T4 of the first output circuit SST2_1 may be turned on in response to the carry clock signal supplied through the carry clock line CR_CLK, and may full down the carry signal using the node voltage of the first node Q (or the low voltage configured to full down the node voltage of the first node Q, for example, the second low voltage applied to the second low voltage line VGL2 shown in FIG. 8C).

The second output circuit SST3_1 may include a first transistor T1, a second transistor T2, and a first capacitor C1. The second transistor T2 may include a first electrode connected to the first output terminal OUT1, a second electrode connected to the first low voltage line VGL1, and a gate electrode connected to an inverted scan clock line SC_CLKB. Here, the inverted scan clock line SC_CLKB may refer to a line to which an inverted clock signal having a waveform complementary to (or having a phase difference of 180 degrees with respect to) a clock signal applied to the scan clock line SC_CLK is applied. For example, when the first scan clock signal SC_CK1 (e.g., see FIG. 7) is applied to the scan clock line SC_CLK, the fifth scan clock signal SC_CK5 may be applied to the inverted scan clock line SC_CLKB. The second transistor T2 may be turned on in response to the inverted clock signal supplied through the inverted scan clock line SC_CLKB, and may full down the scan signal using the first low voltage applied to the first low voltage line VGL1.

As described above, a coupling configuration between the first output circuit SST2_1 and the second output circuit SST3_1 shown in FIG. 8B may be different from the coupling configuration between the first output circuit SST2 and the second output circuit SST3 shown in FIG. 8A. In other words, in a range in which the scan signal and the carry signal may be output, the coupling configuration between the first output circuit SST2_1 (or the first output circuit SST2) and the second output circuit SST3_1 (or the second output circuit SST3) may be variously modified.

Figure 8C:
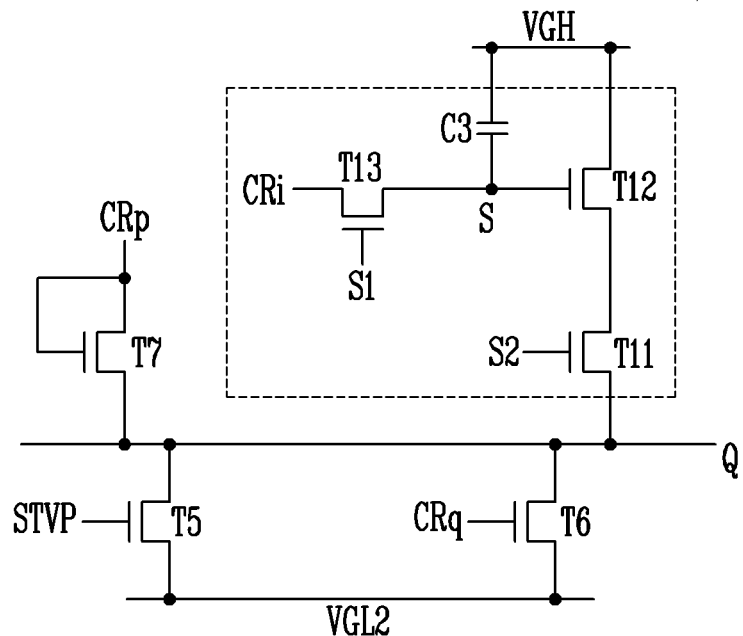
FIG. 8C is a diagram illustrating an example of a node control circuit included in the stage of FIG. 8B.

FIG. 8C is a diagram illustrating an example of a node control circuit included in the stage of FIG. 8A and/or FIG. 8B. In more detail, FIG. 8C illustrates the node control circuit SST1_1 included in the stage STi_1 of FIG. 8B (and/or the node control circuit SST1 included in the stage STi of FIG. 8A).

Referring to FIGS. 8A to 8C, the node control circuit SST1_1 may include a fifth transistor T5, a sixth transistor T6, and a seventh transistor T7.

The seventh transistor T7 may include a first electrode connected to a preceding carry line CRp, a second electrode connected to the first node Q, and a gate electrode connected to the preceding carry line CRp. The seventh transistor T7 may supply the preceding carry signal to the first node Q, in response to the preceding carry signal (e.g. the preceding carry signal having the logic high level) supplied through the preceding carry line CRp. In this case, the first node Q may be changed to, or may be maintained or substantially maintained at, a logic high level.

The fifth transistor T5 may include a first electrode connected to the first node Q, a second electrode connected to the second low voltage line VGL2, and a gate electrode connected to the start signal line STVP. The fifth transistor T5 may be turned on in response to the start signal supplied through the start signal line STVP, and may connect the second low voltage line VGL2 to the first node Q. In this case, the first node Q may have the logic low level by the second low voltage applied to the second low voltage line VGL2. In other words, the first node Q may be initialized or reset. That is, the first node Q may be initialized or reset using the start signal applied to the start signal line STVP as the initialization signal (or the reset signal).

Similar to the fifth transistor T5, the sixth transistor T6 may include a first electrode connected to the first node Q, a second electrode connected to the second low voltage line VGL2, and a gate electrode connected to the subsequent carry line CRq. The sixth transistor T6 may be turned on in response to the subsequent carry signal supplied through the subsequent carry line CRq, and may connect the second low voltage line VGL2 to the first node Q. In other words, the first node Q may be changed from the logic high level to the logic low level, or be reset, by the subsequent carry signal supplied through the subsequent carry line CRq.

FIG. 8C illustrates the fifth to seventh transistors T5 to T7 for controlling the node voltage of the first node Q using the preceding carry signal, the start signal (or the reset signal), and the subsequent carry signal, but the present disclosure is not limited thereto. A coupling configuration of the fifth to seventh transistors T5 to T7 may be variously modified. Furthermore, in an embodiment, the node control circuit SST1_1 may further include one or more transistors configured to maintain or substantially maintain the node voltage of the first node Q at a suitable voltage level (e.g., a predetermined or specific voltage level, for example, such as the logic high level or the logic low level).

In an embodiment, the node control circuit SST1_1 may further include one or more transistors configured to selectively drive only a specific stage (or a pixel of a specific pixel row connected thereto). For example, as illustrated in FIG. 8C, the node control circuit SST1_1 may further include an 11-th transistor T11, a 12-th transistor T12, a 13-th transistor T13, and a third capacitor C3.

The 11-th transistor T11 may include a first electrode connected to a second electrode of the 12-th transistor T12, a second electrode connected to the first node Q, and a gate electrode connected to the second control signal line S2. Here, the second control signal line S2 may be included in the control lines CSS (e.g., see FIG. 6).

The 12-th transistor T12 may include a first electrode connected to a high voltage line VGH, the second electrode connected to the first electrode of the 11-th transistor T11, and a gate electrode connected to a third node S.

The 13-th transistor T13 may include a first electrode connected to a carry line CRi, a second electrode connected to the third node S, and a gate electrode connected to a first control signal line S1. Here, the first control signal line S1 may be included in the control lines CSS (e.g., see FIG. 6).

The third capacitor C3 may be formed or connected between the high voltage line VGH and the third node S.

When a selection signal (or a stage selection signal) is applied to the first control signal line S1, the carry signal applied to the carry line CRi may be applied to the third node S through the 13-th transistor T13. For example, when a corresponding stage outputs a carry signal of a logic high level, the carry signal of the logic high level may be applied to the third node S, the third capacitor C3 may store the carry signal of the logic high level, and the 12-th transistor T12 may be turned on. Because the other stages, except the corresponding stage, may output the carry signal of the logic low level, the 12-th transistor T12 in the other stages may remain turned off. In other words, while the selection signal (or the stage selection signal) is applied to the first control signal line S1, only a stage that outputs the carry signal may be selected.

Thereafter, while a selection driving signal is applied to the second control signal line S2, the 11-th transistor T11 may be turned on. When the 12-th transistor T12 is turned on, a high voltage applied to the high voltage line VGH may be applied to the first node Q through the 11-th transistor T11 and the 12-th transistor T12. In this case, as described with reference to FIG. 8A, a corresponding stage may output a scan signal in response to the node voltage of the first node Q. Because the 12-th transistor T12 in the other stages other than the selected stage remains turned off, the other stages may not output a scan signal.

As described with reference to FIG. 8C, the node control circuit SST1_1 may control the node voltage of the first node Q based on a preceding carry signal, a start signal (or a reset signal), and a subsequent carry signal. Furthermore, the node control circuit SST1_1 may further control the node voltage of the first node Q based on control signals applied through the first control signal line S1 and the second control signal line S2, in relation to the selection driving.

Figure 8D:
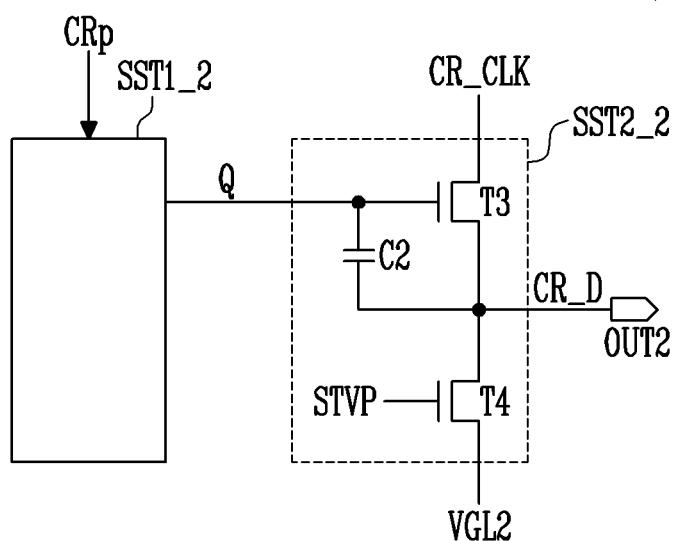
FIG. 8D is a diagram illustrating an example of a dummy stage included in the gate driving circuit of FIG. 6.

FIG. 8D is a diagram illustrating an example of a dummy stage included in the gate driving circuit of FIG. 6.

Referring to FIGS. 8A, 8B, and 8D, the dummy stage ST_D may include a node control circuit SST1_2 and a first output circuit SST2_2. In other words, because the dummy stage ST_D is not connected to the scan line, the second output circuit SST3, which is configured to output the scan signal, may not be included in the dummy stage ST_D.

Because the node control circuit SST1_2 and the first output circuit SST2_2 may be the same or substantially the same as (or similar to) the node control circuit SST1 and the first output circuit SST2 described above with reference to FIG. 8A, respectively, redundant description thereof may not be repeated.

The first output circuit SST2_2 may include a third transistor T3, a fourth transistor T4, and a second capacitor C2. The fourth transistor T4 may include a first electrode connected to the second output terminal OUT2, a second electrode connected to the second low voltage line VGL2, and a gate electrode connected to the start signal line STVP. The fourth transistor T4 of the first output circuit SST2_2 may be turned on in response to the start signal supplied through the start signal line STVP, and may full down the carry signal using the node voltage of the first node Q (or the low voltage configured to full down the node voltage of the first node Q, for example, such as the second low voltage applied to the second low voltage line VGL2 shown in FIG. 8C).

The dummy stage ST_D does not output the scan signal. Thus, even if the carry signal of the logic high level is output until the stages ST1 to STn (e.g., see FIG. 6) output the scan signals, the gate driving circuit 120 may be normally driven. Furthermore, because the dummy stage ST_D may not receive a subsequent carry signal from a subsequent stage, the dummy stage ST_D may be initialized or reset using the start signal supplied through the start signal line STVP as a reset signal. In this case, because the dummy stage ST_D does not include a circuit configuration which is reset based on the subsequent carry signal, the dummy stage ST_D may be more simplified, and may be disposed between other stages (e.g., see FIG. 9).

FIG. 8E is a waveform diagram illustrating the operation of the gate driving circuit of FIG. 6.

Referring to FIGS. 6 and 8A to 8E, the start signal S_STVP may be applied to the start signal line STVP, the first scan clock signal SC_CK1 may be applied to the first scan clock line, the second scan clock signal SC_CK2 may be applied to the second scan clock line, the first carry clock signal CR_CK1 may be applied to the first carry clock line, the second carry clock signal CR_CK2 may be applied to the second carry clock line, the first control signal S_S1 may be applied to the first control signal line S1, the second control signal S_S2 may be applied to the second control signal line S2, the first carry signal S_CR1 may be output through the first carry line CR1, the second carry signal S_CR2 may be output through the second carry line CR2, the first scan signal S_SC1 may be output through the first scan line SC1, and the second scan signal S_SC2 may be output through the second scan line SC2.

One frame may include an active period P_ACTIVE, and a blank period P_BLANK.

At a first time point TP1, the start signal S_STVP may have a pulse of a logic high level. In this case, each of the stages ST1 to STn (and the dummy stage ST_D) may be initialized (e.g., see the node control circuit SST1 of FIG. 8A or the node control circuit SST_1 of FIG. 8B).

The first control signal S_S1 may have the pulse of the logic high level. In this case, the 13-th transistor T13 described above with reference to FIG. 8C may be turned on, and the third node S may be initialized by the carry signal CRi of the logic low level. In other words, the third node S of each of the stages ST1 to STn may be initialized. For example, the third node S of a stage selected in a preceding frame may be initialized.

In the active period P_ACTIVE, the first scan clock signal SC_CK1 and the second scan clock signal SC_CK2 (and other scan clock signals not shown, see FIG. 7) may alternately have a logic high level and a logic low level in response to the start signal S_STVP of the logic high level.

At a second time point TP2, the first scan signal S_SC1 may have a logic high level in response to the first scan clock signal SC_CK1, and the first carry signal S_CR1 may have a logic high level in response to the first carry clock signal CR_CK1. At a third time point TP3, the second scan signal S_SC2 may have a logic high level in response to the second scan clock signal SC_CK2, and the second carry signal S_CR2 may have a logic high level in response to the second carry clock signal CR_CK2. In other words, in the active period P_ACTIVE, the carry signals having a logic high level may be successively output, and the scan signals having a logic high level may be successively output.

At a certain time point in the active period P_ACTIVE, the first control signal S_S1 may have a logic high level. For example, as illustrated in FIG. 8E, at a fourth time point TP4, the first control signal S_S1 may have a logic high level.

In this case, the first stage ST1 configured to output the first carry signal S_CR1 of the logic high level may be selected. Referring to FIG. 8C, for example, the third node S in the first stage ST1 may be changed to have a logic high level in response to the first carry signal S_CR1, and the node voltage of the third node S may be maintained or substantially maintained at a logic high level by the third capacitor C3.

Subsequently, in the blank period P_BLANK, the second control signal S_S2 may have the pulse of a logic high level, and only the scan clock signal corresponding to the selected stage may have a logic high level.

For example, as illustrated in FIG. 8E, at a fifth time point TP5, the second control signal S_S2 may have the pulse of a logic high level. In this case, the 11-th transistor T11 in the first stage ST1 may be turned on, and the first node Q in the first stage ST1 may be changed to a logic high level. Because the first scan clock signal SC_CK1 has a logic low level, the first scan signal S_SC1 may have a logic low level (e.g., see the second output circuits SST3 and SST3_1 of FIGS. 8A and 8B).

At a sixth time point TP6, only the first scan clock signal SC_CK1 may have a logic high level. In this case, because the first stage ST1 outputs the first scan clock signal SC_CK1 as the first scan signal S_SC1, the first scan signal S_SC1 may have a logic high level.

As described above, the gate driving circuit 120 may successively output the scan signals and the carry signals in the active period P_ACTIVE, and may output the scan signal through only the selected stage in the blank period P_BLANK.

Figure 9:
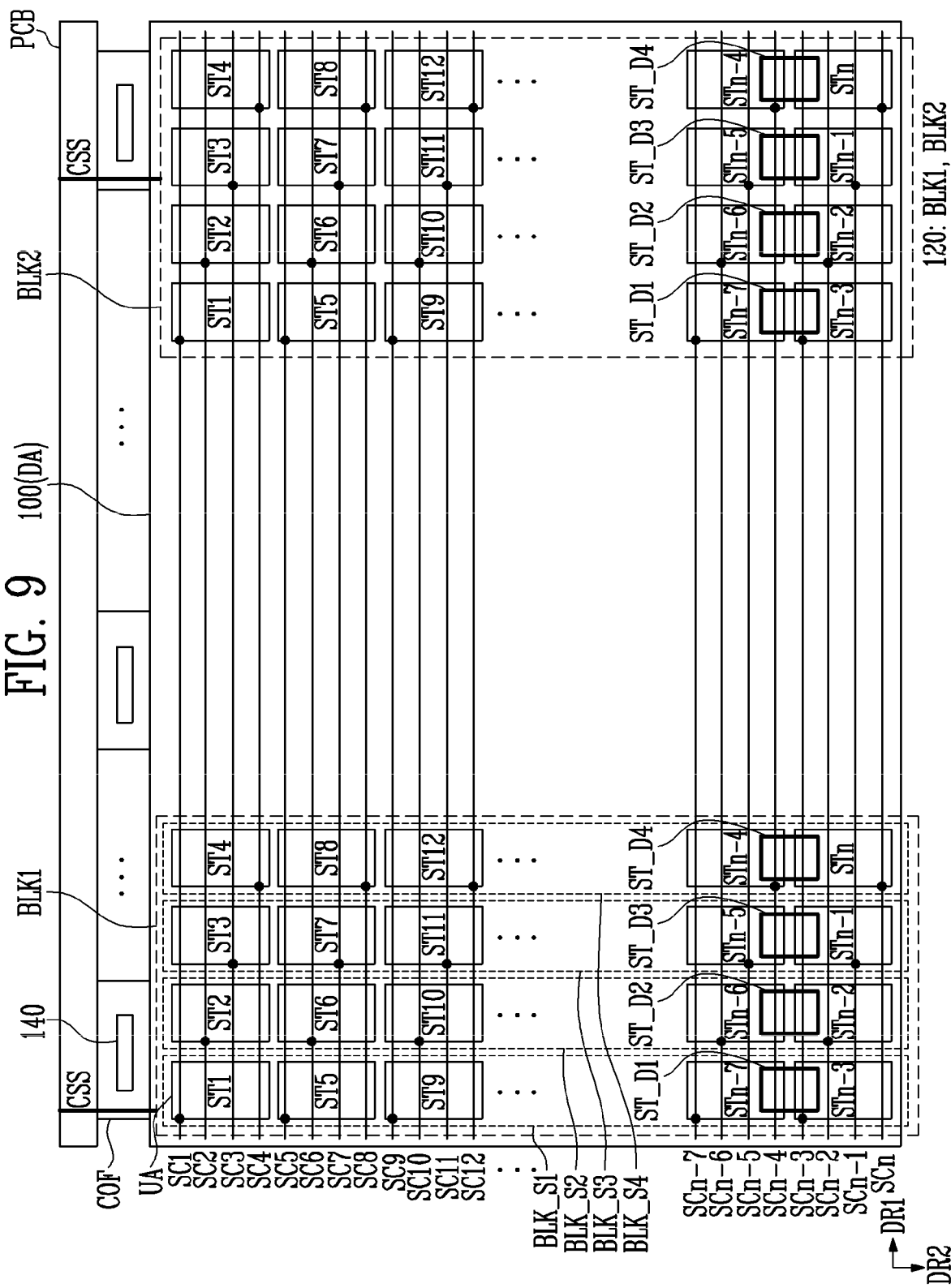
FIG. 9 is a diagram illustrating an example of a display panel included in the display device of FIG. 1.

FIG. 9 is a diagram illustrating an example of a display panel included in the display device of FIG. 1. Because the display panels 100 shown in FIG. 1 may be the same or substantially the same as (or similar to) each other, one of the display panels 100 will be described in more detail with reference to FIG. 9. In other words, each of the first display panel 101, the second display panel 102, the third display panel 103, and the fourth display panel 104 shown in FIG. 1 may have the same or substantially the same structure as that of the one display panel 100 shown in FIG. 9, and thus, redundant description thereof may not be repeated.

Referring to FIGS. 1 and 9, the display panel 100 may be connected to a data driver 140 through a connection film COF. Furthermore, the display panel 100 may receive clock signals and control signals from an external device (e.g. a timing controller, a power supply, and/or the like) through a printed circuit board PCB and the connection film COF.

As illustrated in FIG. 9, the data driver 140 may be implemented as an integrated circuit to be mounted on a central portion of the connection film COF. The data driver 140 may receive image data from an external device through the printed circuit board PCB and the connection film COF, and may generate data voltages corresponding to grayscale values (or data values) included in the image data. The data driver 140 may transmit the data voltages to the pixels PXL (e.g., see FIG. 10A) through the display panel 100 (e.g., through data lines DL in the display panel 100, see FIG. 10A) via the connection film COF. Control lines CSS (or transmission lines) extending from the printed circuit board PCB and connecting the display panels 100 to each other may be disposed adjacent to a short side of the connection film COF in the first direction DR1, and control signals may be transmitted through the control lines CSS to the display panel 100.

The connection film COF may include only one conductive layer, and the control lines CSS (or the transmission lines) may not cross with the data lines DL extending from the data driver 140 to be disposed between the display panels 100. On the other hand, in order for the control lines CSS and the data lines DL to cross each other at (e.g., in or on) the connection film COF, the connection film COF may include at least two conductive layers, but in this case, manufacturing costs of the connection film COF may increase.

As illustrated in FIG. 9, the display panel 100 may be connected to a plurality of connection films COF and a plurality of data drivers 140. However, the present disclosure is not limited thereto, and the display panel 100 may be connected to one connection film COF and one data driver 140, or any suitable number of connection films COF and data drivers 140.

The display panel 100 may include the gate driving circuit 120 (e.g., see FIG. 6), which may be distributedly disposed at (e.g., in or on) the display area DA. As described above with reference to FIGS. 1 and 2, in order to minimize or reduce the non-display area of the display panel 100, the gate driving circuit 120 may be distributedly disposed at (e.g., in or on) the display area DA. In other words, components of the gate driving circuit 120 may be distributed along the display area DA.

In one or more embodiments, the gate driving circuit 120 may include a plurality of blocks BLK1 and BLK2 (or sub-gate driving circuits).

For example, as illustrated in FIG. 9, the gate driving circuit 120 may include a first block BLK1 adjacent to one side of the display panel 100, and a second block BLK2 adjacent to another side of the display panel 100.

Each of the first block BLK1 and the second block BLK2 may be connected to the scan lines SC1 to SCn included in the display panel 100. The first block BLK1 and the second block BLK2 may supply scan signals to the scan lines SC1 to SCn at the same or substantially the same timing as each other. Because the scan signals are supplied from left and right sides of the display panel 100 through the first block BLK1 and the second block BLK2, a delay and an attenuation of the scan signals due to a load of the scan lines SC1 to SCn may be alleviated (e.g., may be reduced).

Because the first block BLK1 and the second block BLK2 are the same or substantially the same as (or similar to) each other except for their locations, the first block BLK1 will be described in more detail hereinafter, and redundant description with respect to the second block BLK2 may not be repeated.

The first block BLK1 may include the stages ST1 to STn described above with reference to FIG. 6. Furthermore, the first block BLK1 may further include dummy stages ST_D1 to ST_D4. Each of the dummy stages ST_D1 to ST_D4 may correspond to the dummy stage ST_D described above with reference to FIG. 6.

Each of the stages ST1 to STn may be distributedly disposed at (e.g., in or on) a unit area UA (e.g., a unit area UA where a plurality of pixel rows and a plurality of pixel columns cross each other) across which the plurality of scan lines SC1 to SCn are disposed. As illustrated in FIG. 9, the first stage ST1 may be disposed at (e.g., in or on) the unit area UA across which the first to fourth scan lines SC1 to SC4 are disposed. In other words, the stages ST1 to STn may be disposed at (e.g., in or on) a unit area UA corresponding to each of four corresponding scan lines. However, the present disclosure is not limited thereto. In consideration of a number and capacity of transistors and capacitors forming the stages ST1 to STn, each of the stages ST1 to STn may be disposed in a corresponding unit area UA corresponding to two, three, five, or more scan lines.

The stages ST1 to STn may be divided into a plurality of sub-blocks BLK_S1 to BLK_S4, and may be disposed at (e.g., in or on) regions that are spaced apart (e.g., that are separated) from each other. As illustrated in FIG. 9, the stages ST1 to STn may be divided into first to fourth sub-blocks BLK_S1 to BLK_S4. As will be described in more detail below with reference to FIG. 10A, the stages ST1 to STn may be divided by the clock lines (e.g. the carry clock lines or the scan clock lines), and may be divided into the four sub-blocks BLK_S1 to BLK_S4 based on the eight clock lines CLKS1 to CLKS8 described above with reference to FIG. 6. However, the present disclosure is not limited thereto, and the stages ST1 to STn may be divided into eight sub-blocks or two sub-blocks.

The first sub-block BLK_S1 may include a first stage ST1, a fifth stage ST5, a ninth stage ST9, a n−7-th stage STn−7, and a n−3-th stage STn−3. In other words, the first sub-block BLK_S1 may include the stages connected to the first clock lines CLKS1 or the fifth clock lines CLKS5 described above with reference to FIG. 6.

In an embodiment, the stages ST1, ST5, ST9, STn−7, and STn−3 may be disposed at (e.g., in or on) the first sub-block BLK_S1 to be spaced apart from each other. For example, the first stage ST1 and the fifth stage ST5 may be spaced apart from each other (e.g., in the second direction DR2) to have a space therebetween that allows at least one line to extend in the first direction DR1 between the first and fifth stages ST1 and ST5. Therefore, connection lines, which will be described in more detail with reference to FIGS. 9 to 11, may be disposed between at least some of the stages ST1 to STn.

Furthermore, the first sub-block BLK_S1 may further include a first dummy stage ST_D1.

The first dummy stage ST_D1 may be disposed to be spaced apart farther from an edge of the display panel 100 when compared to the n−3-th stage STn−3, which is the last stage of the first sub-block BLK_S1. As illustrated in FIG. 9, the first dummy stage ST_D1 may be disposed between the n−3-th stage STn−3 and the n−7-th stage STn−7.

Likewise, the second sub-block BLK_S2 may include a second stage ST2, a sixth stage ST6, a tenth stage ST10, an n−6-th stage STn−6, an n−2-th stage STn−2, and a second dummy stage ST_D2, each of which are connected to the second clock lines CLKS2 or the sixth clock lines CLKS6 described above with reference to FIG. 6. The third sub-block BLK_S3 may include a third stage ST3, a seventh stage ST7, an 11-th stage ST11, an n−5-th stage STn−5, an n−1-th stage STn−1, and a third dummy stage ST_D3, each of which are connected to the third clock lines CLKS3 or the seventh clock lines CLKS7 described above with reference to FIG. 6. The fourth sub-block BLK_S4 may include a fourth stage ST4, an eighth stage ST8, a 12-th stage ST12, an n−4-th stage STn−4, an n-th stage STn, and a fourth dummy stage ST_D4, each of which are connected to the fourth clock lines CLKS4 or the eighth clock lines CLKS8 described above with reference to FIG. 6.

When the stages ST1 to STn are divided into the first to fourth sub-blocks BLK_S1 to BLK_S4, the clock lines CLKS1 to CLKS8 described above with reference to FIG. 6 may be distributedly disposed to be adjacent to a corresponding sub-block, and interference between (e.g. capacitance due to overlapping of) the clock lines CLKS1 to CLKS8 may be reduced. In more detail, as the stages ST1 to STn are disposed at (e.g., in or on) the corresponding sub-block to be sufficiently spaced apart from each other in the second direction DR2, a space in which the connection lines (e.g. the connection lines extending in the first direction DR1) for the clock lines CLKS1 to CLKS8 (and the control lines CSS) are disposed may be secured.

Furthermore, because each of the first to fourth sub-blocks BLK_S1 to BLK_S4 includes only the stages having a relationship that shares a carry signal (e.g., provides a preceding carry signal or a subsequent carry signal), a carry signal line configured to transmit the carry signal between the first to fourth sub-blocks BLK_S1 to BLK_S4 may be omitted (e.g., may be removed), and parasitic capacitance for the carry signal line may also be reduced.

Although FIG. 9 illustrates that the first to fourth stages ST1 to ST4 are disposed at (e.g., in or on) the same row as each other, the present disclosure is not limited thereto. For example, the first to fourth stages ST1 to ST4 may be disposed to be staggered in the first direction DR1.

Figure 10A:
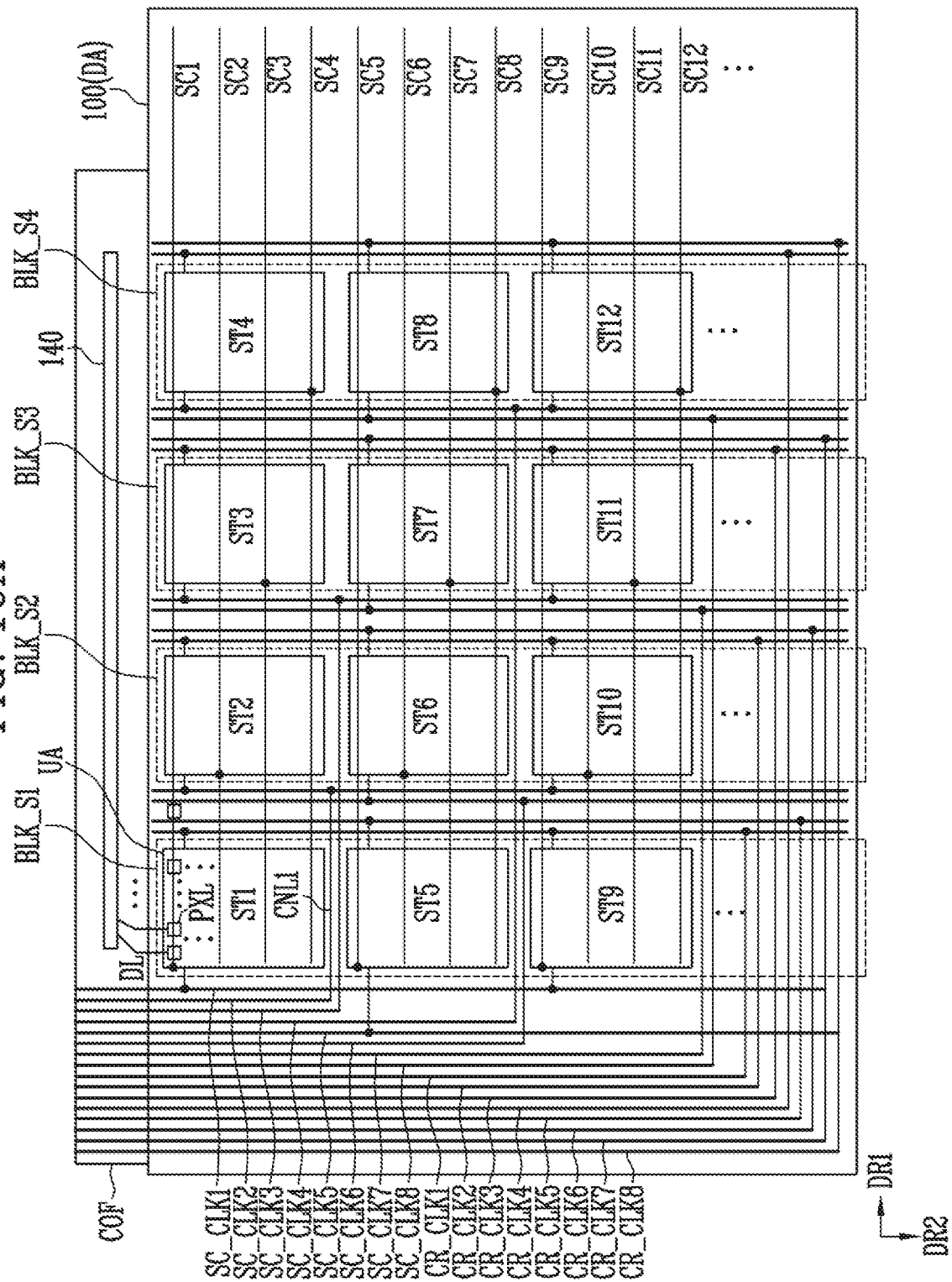
FIG. 10A is a diagram illustrating an example of a first block included in the display panel of FIG. 9.

FIG. 10A is a diagram illustrating an example of a first block included in the display panel of FIG. 9. FIG. 10A schematically illustrates an enlarged partial view of the display panel 100 of FIG. 9 focused on the clock lines SC_CLK1 to SC_CLK8 and CR_CLK1 to CR_CLK8.

Referring to FIGS. 9 and 10A, the clock lines SC_CLK1 to SC_CLK8, and CR_CLK1 to CR_CLK8 may include the first to eighth scan clock lines SC_CLK1 to SC_CLK8 and the first to eighth carry clock lines CR_CLK1 to CR_CLK8. The first to eighth scan clock signals SC_CK1 to SC_CK8 described above with reference to FIG. 7 may be applied to the first to eighth scan clock lines SC_CLK1 to SC_CLK8, respectively, and the first to eighth carry clock signals CR_CK1 to CR_CK8 may be applied to the first to eighth carry clock lines CR_CLK1 to CR_CLK8, respectively.

The clock lines SC_CLK1 to SC_CLK8 and CR_CLK1 to CR_CLK8 may extend to the connection film COF, or may be connected to transmission lines on the connection film COF, and may receive clock signals from an external device (e.g., a timing controller through the printed circuit board PCB described above with reference to FIG. 9).

At least some of the clock lines SC_CLK1 to SC_CLK8 and CR_CLK1 to CR_CLK8 may be distributedly disposed at (e.g., in or on) the display panel 100 through first connection lines CNL1 extending in the first direction DR1. The clock lines SC_CLK1 to SC_CLK8 and CR_CLK1 to CR_CLK8 may cross with the scan lines SC1 to SC12 at (e.g., in or on) the display area DA.

In one or more embodiments, from among the clock lines SC_CLK1 to SC_CLK8 and CR_CLK1 to CR_CLK8, two clock lines to which two clock signals having a phase difference of 180 degrees are applied may be arranged in one pair. As described above, because noises caused by the two clock signals having the phase difference of 180 degrees may be offset from each other, the influence of the clock lines on an adjacent pixel PXL may be reduced. In an embodiment, the scan clock lines SC_CLK1 to SC_CLK8 may be disposed adjacent to one side of a corresponding sub-block, and the carry clock lines CR_CLK1 to CR_CLK8 may be disposed adjacent to another side of a corresponding sub-block.

For example, the first carry clock line CR_CLK1 and the fifth carry clock line CR_CLK5 for the first sub-block BLK_S1 may extend in the second direction DR2 between the first sub-block BLK_S1 and the second sub-block BLK_S2 to form a pair. Furthermore, the second scan clock line SC_CLK2 and the sixth scan clock line SC_CLK6 for the second sub-block BLK_S2 may extend in the second direction DR2 between the first sub-block BLK_S1 and the second sub-block BLK_S2 to form a pair. In an embodiment, the second scan clock line SC_CLK2 and the sixth scan clock line SC_CLK6 may be spaced apart from the first carry clock line CR_CLK1 and the fifth carry clock line CR_CLK5 with at least one pixel PXL interposed therebetween.

Similarly, between the second sub-block BLK_S2 and the third sub-block BLK_S3, the second carry clock line CR_CLK2 and the sixth carry clock line CR_CLK6 for the second sub-block BLK_S2 may be arranged in a pair, and the third scan clock line SC_CLK3 and the seventh scan clock line SC CLK7 for the third sub-block BLK_S3 may be arranged in a pair. Between the third sub-block BLK_S3 and the fourth sub-block BLK_S4, the third carry clock line CR_CLK3 and the seventh carry clock line CR_CLK7 may be arranged in a pair, and the fourth scan clock line SC_CLK4 and the eighth scan clock line SC_CLK8 may be arranged in a pair. At (e.g., in or on) one side of the fourth sub-block BLK_S4, the fourth carry clock line CR_CLK4 and the eighth carry clock line CR_CLK8 may be arranged in a pair. At (e.g., in or on) one side of the first sub-block BLK_S1, the first scan clock line SC_CLK1 and the fifth scan clock line SC_CLK5 may be arranged in a pair.

The clock lines SC_CLK1 to SC_CLK8 and CR_CLK1 to CR_CLK8 distributed and arranged between the first to fourth sub-blocks BLK_S1 to BLK_S4 (e.g., or at (e.g., in or on) corresponding sides thereof) may be connected to the connection film COF through the first connection lines CNL1. In other words, the clock lines SC_CLK1 to SC_CLK8 and CR_CLK1 to CR_CLK8 in the display panel 100 may be disposed between the pixels PXL (or between the data lines), using the first connection lines CNL1, even if the arrangement of the clock lines SC_CLK1 to SC_CLK8 and CR_CLK1 to CR_CLK8 in the connection film COF is not changed.

For example, as illustrated in FIG. 10A, the second scan clock line SC_CLK2 and the third scan clock line SC_CLK3 may be connected to the connection film COF through the first connection lines CNL1 between the first stage ST1 and the five stage ST5. For example, the fourth scan clock line SC_CLK4 and the sixth scan clock line SC_CLK6 may be connected to the connection film COF through the first connection lines CNL1 between the five stage ST5 and the ninth stage ST9.

Although FIG. 10A illustrates that two first connection lines CNL1 are disposed between two corresponding stages, the present disclosure is not limited thereto. For example, one first connection line CNL1 or three or more first connection lines CNL1 may be disposed between two corresponding stages.

Furthermore, although FIG. 10A illustrates that the clock lines SC_CLK1 to SC_CLK8 and CR_CLK1 to CR_CLK8 are successively routed, the present disclosure is not limited thereto. As described above, signals having complementary waveforms may be routed together. For example, the second scan clock line SC_CLK2 and the sixth scan clock line SC_CLK6 may be connected to the first connection lines CNL1 between the first stage ST1 and the fifth stage ST5.

As described above, the clock lines to which the clock signals having complementary waveforms are applied may be arranged in pairs. Therefore, the influence of the clock lines on the pixels PXL may be reduced. Furthermore, the clock lines SC_CLK1 to SC_CLK8 and CR_CLK1 to CR_CLK8 may be connected to the connection film COF through the first connection lines CNL1 disposed between the stages. Thus, a structure (e.g. the connection film including at least two conductive layers to implement lines crossing with each other) for locating (e.g., for arranging) the clock lines SC_CLK1 to SC_CLK8 and CR_CLK1 to CR_CLK8 between the data lines DL at (e.g., in or on) the connection film COF may not be used, and the manufacturing costs of the display device 1000 (e.g., see FIG. 1) may be reduced.

Figure 10B:
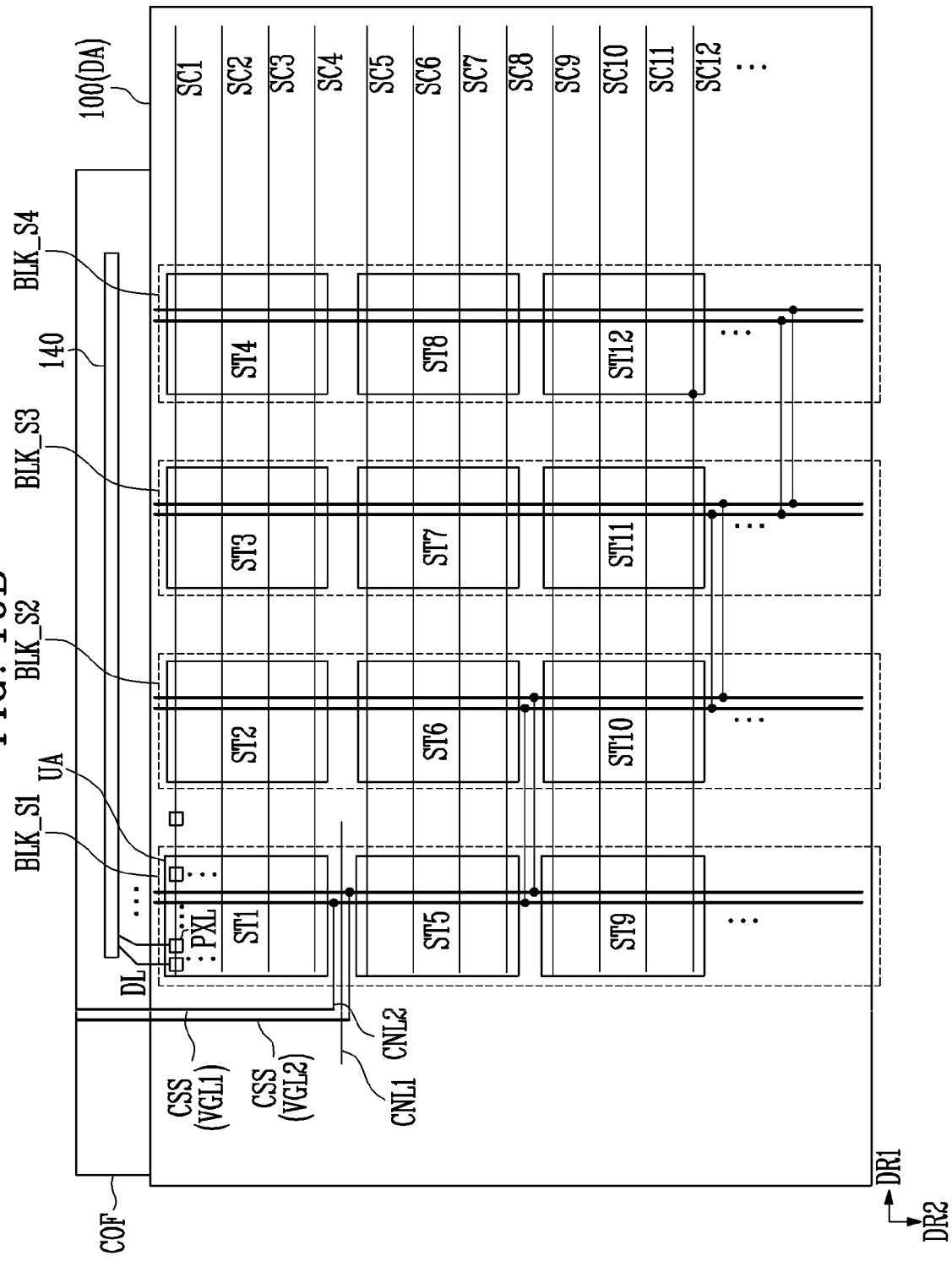
FIG. 10B is a diagram illustrating an example of a first block included in the display panel of FIG. 9.

FIG. 10B is a diagram illustrating an example of a first block included in the display panel of FIG. 9. FIG. 10B schematically illustrates an enlarged partial view of the display panel 100 of FIG. 9 focused on the control lines CSS.

Referring to FIGS. 9 and 10B, the control lines CSS may include a first low voltage line VGL1 and a second low voltage line VGL2. The first low voltage line VGL1 and the second low voltage line VGL2 may correspond to the first low voltage line VGL1 and the second low voltage line VGL2 described above with reference to FIGS. 8A to 8D.

The first low voltage line VGL1 and the second low voltage line VGL2 may extend to the connection film COF, or may be connected to transmission lines on the connection film COF, and may receive low voltages (or power voltages) from an external device (e.g., the power supply through the printed circuit board PCB described above with reference to FIG. 9).

The first low voltage line VGL1 and the second low voltage line VGL2 may be distributedly disposed in the display panel 100 through the second connection lines CNL2 extending in the first direction DR1.

The first low voltage line VGL1 and the second low voltage line VGL2 may be disposed across the stages ST1, ST5, and ST9 in the first sub-block BLK_S1. However, the present disclosure is not limited thereto. For example, with reference to the first sub-block BLK_S1, the first low voltage line VGL1 and the second low voltage line VGL2 may be disposed to be adjacent to at least one side of the stages ST1, ST5, ST9 to STn−7, and STn−3.

Similarly, the first low voltage line VGL1 and the second low voltage line VGL2 may be disposed across the stages ST2, ST6, and ST10 in the second sub-block BLK_S2, the first low voltage line VGL1 and the second low voltage line VGL2 may be disposed across the stages ST3, ST7, and ST11 in the third sub-block BLK_S3, and the first low voltage line VGL1 and the second low voltage line VGL2 may be disposed across the stages ST4, ST8, and ST12 in the fourth sub-block BLK_S4.

For example, the first low voltage line VGL1 may be connected to the connection film COF through the second connection line CNL2 extending between the first stage ST1 and the fifth stage ST5. Furthermore, the first low voltage line VGL1 may be connected to the connection film COF through the second connection line CNL2 extending between the sixth stage ST6 and the tenth stage ST10. Similarly, the second low voltage line VGL2 may be connected to the connection film COF through the second connection line CNL2 extending between the first stage ST1 and the fifth stage ST5, and the second connection line CNL2 extending between the sixth stage ST6 and the tenth stage ST10. In the above-described manner, each of the first low voltage line VGL1 and the second low voltage line VGL2 may be arranged to be connected to all stages ST1 to ST12.

In an embodiment, the second connection lines CNL2 that are adjacent to a corresponding first connection line CNL1 may be disposed to be more adjacent (e.g., to be closer) to a corresponding pixel PXL (or a corresponding stage) when compared to the corresponding first connection line CNL1. In other words, the corresponding first connection line CNL1 may be arranged between two adjacent ones of the second connection lines CNL2.

As illustrated in FIG. 10B, the second connection line CNL2 connected to the first low voltage line VGL1 may be disposed adjacent to (e.g., more closer to) the first stage ST1 (or the pixel PXL connected to the fourth scan line SC4) when compared to the first connection line CNL1 extending between the first stage ST1 and the fifth stage ST5. Similarly, the second connection line CNL2 connected to the second low voltage line VGL2 may be disposed adjacent to (e.g., more closer to) the fifth stage ST5 (or the pixel PXL connected to the fifth scan line SC5) when compared to the first connection line CNL1 extending between the first stage ST1 and the fifth stage ST5. In other words, the first connection line CNL1 may be disposed between at least one pair of second connection lines CNL2. In this case, the second connection lines CNL2 to which DC-type low voltages are applied may shield the first connection line CNL1 to which an AC-type clock signal is applied, and may suppress or prevent a coupling between the first connection line CNL1 and the pixels PXL.

Although FIG. 10B illustrates that two second connection lines CNL2 are disposed between two corresponding stages, the present disclosure is not limited thereto. Three or more second connection lines CNL2 may be disposed between the two corresponding stages.

Furthermore, although FIG. 10B illustrates that the second connection lines CNL2 are locally disposed at (e.g., in or on) the display panel 100, the present disclosure is not limited thereto. For example, the second connection lines CNL2 may extend from a first end to a second end of the display panel 100 in the second direction DR2, and the second connection lines CNL2 may form a mesh structure using one stage as a basic unit.

When control signal lines for controlling the stages ST1 to ST12 in common are further included in the control lines CSS, the corresponding control signal lines may be distributedly disposed in the display panel 100 through the connection lines, similarly to the first and second low voltage lines VGL1 and VGL2 illustrated in FIG. 10B.

As described above, the control lines CSS (or the first and second low voltage lines VGL1 and VGL2) may be connected to the connection film COF through the second connection lines CNL2 disposed between the stages ST1 to ST12. Therefore, a structure (e.g. the connection film including at least two conductive layers to implement lines crossing with each other) for locating the control lines CSS between the data lines DL in the connection film COF may not be used.

Figure 11:
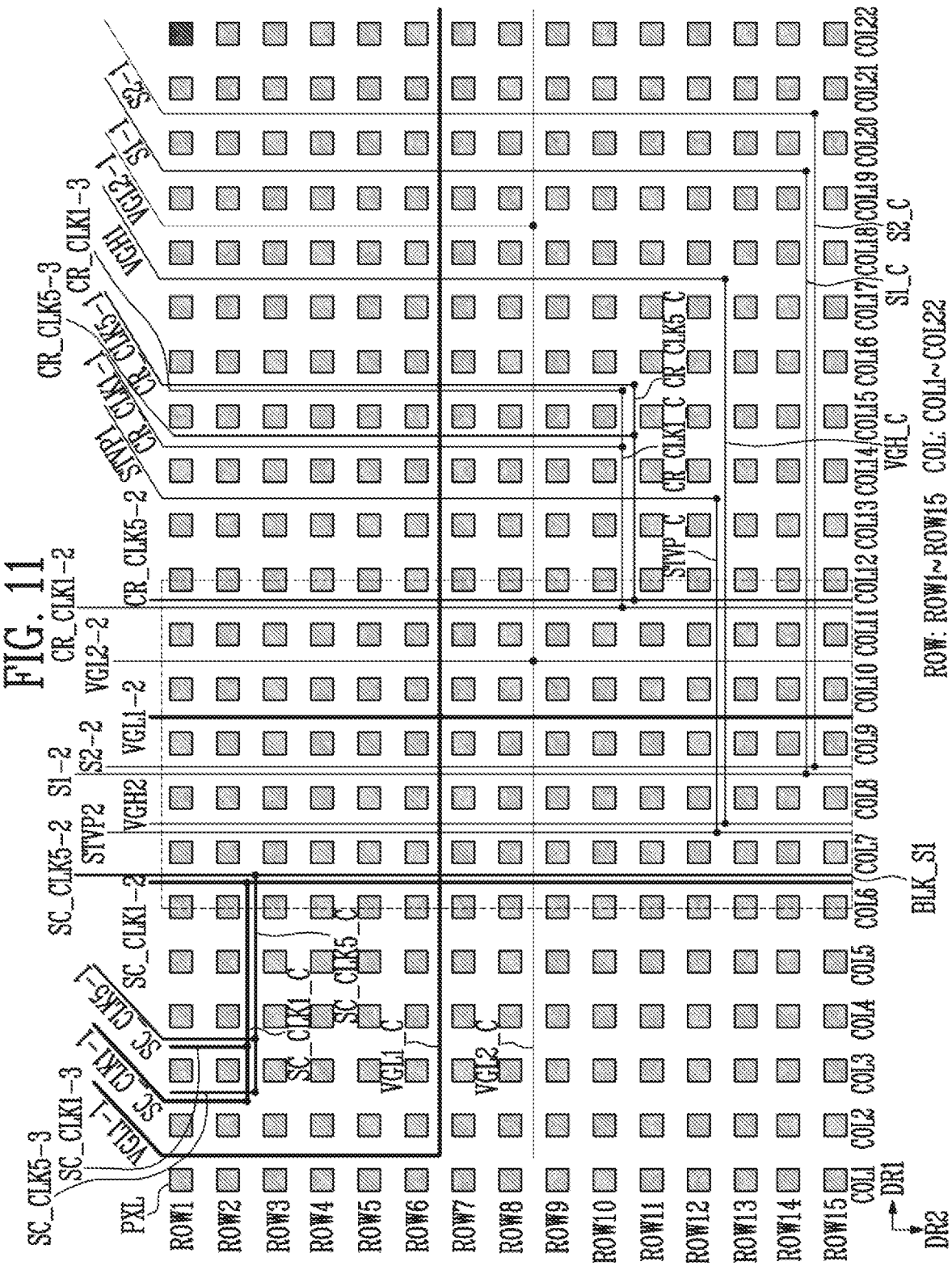
FIG. 11 is a diagram illustrating an example of control lines included in the display panel of FIG. 9.

FIG. 11 is a diagram illustrating an example of control lines included in the display panel of FIG. 9. FIG. 11 schematically illustrates the arrangement of the control lines with respect to the first sub-block BLK_S1.

Referring to FIGS. 9 and 11, the pixels PXL may be arranged in pixel rows ROW (e.g. pixel rows ROW1 to ROW15) and pixel columns COL (e.g. pixel columns COL1 to COL22).

The first sub-block BLK_S1 may be arranged between a sixth pixel column COLE and a 12-th pixel column COL12. However the present disclosure is not limited to the illustration shown in FIG. 11, and the arrangement of the first sub-block BLK_S1 may be variously modified.

A 1-1-th low voltage line VGL1-1 may extend in the second direction DR2 between the first pixel column COL1 and the second pixel column COL2. The 1-1-th low voltage line VGL1-1 may be connected to an external device (e.g. a connection film COF, a pad, and/or the like). A 1-2-th low voltage line VGL1-2 may extend in the second direction DR2 between a ninth pixel column COL9 and a tenth pixel column COL10. The 1-1-th low voltage line VGL1-1 and the 1-2-th low voltage line VGL1-2 may be connected to each other through a first low voltage connection line VGL1_C extending in the first direction DR1 between the sixth pixel row ROVE and the seventh pixel row ROVV7. The 1-1-th low voltage line VGL1-1 and the 1-2-th low voltage line VGL1-2 may form the first low voltage line VGL1 described above with reference to FIG. 10B, and the first low voltage connection line VGL1_C may be included in the second connection line CNL2 described above with reference to FIG. 10B.

A 1-1-th scan clock line SC_CLK1-1 may extend in the second direction DR2 between the second pixel column COL2 and the third pixel column COL3. The 1-1-th scan clock line SC_CLK1-1 may be connected to an external device (e.g. a connection film COF, a pad, and/or the like). A 1-2-th scan clock line SC_CLK1-2 may extend in the second direction DR2 between the sixth pixel column COLE and the seventh pixel column COL7. The 1-1-th scan clock line SC_CLK1-1 and the 1-2-th scan clock line SC_CLK1-2 may be connected to each other through a first scan clock connection line SC_CLK1_C extending in the first direction DR1 between the second pixel row ROW2 and the third pixel row ROW3. The 1-1-th scan clock line SC_CLK1-1 and the 1-2-th scan clock line SC_CLK1-2 may form the first scan clock line SC_CLK1 described above with reference to FIG. 10A, and the first scan clock connection line SC_CLK1_C may be included in the first connection line CNL1 described above with reference to FIG. 10A.

A 5-1-th scan clock line SC_CLK5-1 may extend in the second direction DR2 between the third pixel column COL3 and the fourth pixel column COL4. The 5-1-th scan clock line SC_CLK5-1 may be connected to an external device (e.g. a connection film COF, a pad, and/or the like). A 5-2-th scan clock line SC_CLK5-2 may extend in the second direction DR2 between the sixth pixel column COLE and the seventh pixel column COL7. The 5-1-th scan clock line SC_CLK5-1 and the 5-2-th scan clock line SC_CLK5-2 may be connected to each other through a fifth scan clock connection line SC_CLK5_C extending in the first direction DR1 between the second pixel row ROW2 and the third pixel row ROW3. The 5-1-th scan clock line SC_CLK5-1 and the 5-2-th scan clock line SC_CLK5-2 may form the fifth scan clock line SC_CLK5 described above with reference to FIG. 10A, and the fifth scan clock connection line SC_CLK5_C may be included in the first connection line CNL1 described above with reference to FIG. 10A.

In an embodiment, a 1-3-th scan clock line SC_CLK1-3 may extend in the second direction DR2 between the third pixel column COL3 and the fourth pixel column COL4 to correspond to the 5-1-th scan clock line SC_CLK5-1, and may be connected to the first scan clock connection line SC_CLK1_C. Furthermore, a 5-3-th scan clock line SC_CLK5-3 may extend in the second direction DR2 between the second pixel column COL2 and the third pixel column COL3 to correspond to the 1-1-th scan clock line SC_CLK1-1, and may be connected to the fifth scan clock connection line SC_CLK5_C. In this case, the first scan clock line SC_CLK1 and the fifth scan clock line SC_CLK5 may be arranged in pairs throughout the display panel. The first scan clock line SC_CLK1 and the fifth scan clock line SC_CLK5 may reduce an influence on adjacent pixels by transmitting scan clock signals that are complementary to each other.

A first start signal line STVP1 may extend in the second direction DR2 between a 13-th pixel column COL13 and a 14-th pixel column COL14. The first start signal line STVP1 may be connected to an external device (e.g. a connection film COF, a pad, and/or the like). A second start signal line STVP2 may extend in the second direction DR2 between a seventh pixel column COL7 and an eighth pixel column COL8. The first start signal line STVP1 and the second start signal line STVP2 may be connected to each other through a start signal connection line STVP_C extending in the first direction DR1 between a 12-th pixel row ROW12 and a 13-th pixel row ROW13.

A 1-1-th carry clock line CR_CLK1-1 may extend in the second direction DR2 between a 14-th pixel column COL14 and a 15-th pixel column COL15. The 1-1-th carry clock line CR_CLK1-1 may be connected to an external device (e.g. a connection film COF, a pad, and/or the like). A 1-2-th carry clock line CR_CLK1-2 may extend in the second direction DR2 between the 11-th pixel column COL11 and the 12-th pixel column COL12. The 1-1-th carry clock line CR_CLK1-1 and the 1-2-th carry clock line CR_CLK1-2 may be connected to each other through a first carry clock connection line CR_CLK1_C extending in the first direction DR1 between the tenth pixel row ROW10 and the 11-th pixel row ROW11. The 1-1-th carry clock line CR_CLK1-1 and the 1-2-th carry clock line CR_CLK1-2 may form the first carry clock line CR_CLK1 described above with reference to FIG. 10A, and the first carry clock connection line CR_CLK1_C may be included in the first connection line CNL1 described above with reference to FIG. 10A.

A 5-1-th carry clock line CR_CLK5-1 may extend in the second direction DR2 between the 15-th pixel column COL15 and the 16-th pixel column COL16. The 5-1-th carry clock line CR_CLK5-1 may be connected to an external device (e.g. a connection film COF, a pad, and/or the like). A 5-2-th carry clock line CR_CLK5-2 may extend in the second direction DR2 between the 11-th pixel column COL11 and the 12-th pixel column COL12. The 5-1-th carry clock line CR_CLK5-1 and the 5-2-th carry clock line CR_CLK5-2 may be connected to each other through a fifth carry clock connection line CR_CLK5_C extending in the first direction DR1 between the tenth pixel row ROW10 and the 11-th pixel row ROW11. The 5-1-th carry clock line CR_CLK5-1 and the 5-2-th carry clock line CR_CLK5-2 may form the fifth carry clock line CR_CLK5 described above with reference to FIG. 10A, and the fifth carry clock connection line CR_CLK5_C may be included in the first connection line CNL1 described above with reference to FIG. 10A.

In an embodiment, a 1-3-th carry clock line CR_CLK1-3 may extend in the second direction DR2 between the 15-th pixel column COL15 and the 16-th pixel column COL16 to correspond to the 5-1-th carry clock line CR_CLK5-1, and may be connected to the first carry clock connection line CR_CLK1_C. Furthermore, a 5-3-th carry clock line CR_CLK5-3 may extend in the second direction DR2 between the 14-th pixel column COL14 and the 15-th pixel column COL15 to correspond to the 1-1-th carry clock line CR_CLK1-1, and may be connected to the fifth carry clock connection line CR_CLK5_C. In this case, the first carry clock line CR_CLK1 and the fifth carry clock line CR_CLK5 may be arranged in pairs throughout the display panel.

A first high voltage line VGH1 may extend in the second direction DR2 between a 17-th pixel column COL17 and a 18-th pixel column COL18. The first high voltage line VGH1 may be connected to an external device. A second high voltage line VGH2 may extend in the second direction DR2 between the seventh pixel column COL7 and the eighth pixel column COL8. The first high voltage line VGH1 and the second high voltage line VGH2 may be connected to each other through a high voltage connection line VGH_C extending in the first direction DR1 between the 12-th pixel row ROW12 and the 13-th pixel row ROW13.

A 2-1-th low voltage line VGL2-1 may extend in the second direction DR2 between the 18-th pixel column COL18 and the 19-th pixel column COL19. The 2-1-th low voltage line VGL2-1 may be connected to an external device. A 2-2-th low voltage line VGL2-2 may extend in the second direction DR2 between the tenth pixel column COL10 and the 11-th pixel column COL11. The 2-1-th low voltage line VGL2-1 and the 2-2-th low voltage line VGL2-2 may be connected to each other through a second low voltage connection line VGL2_C extending in the first direction DR1 between the eighth pixel row ROW8 and the ninth pixel row ROW9. The 2-1-th low voltage line VGL2-1 and the 2-2-th low voltage line VGL2-2 may form the second low voltage line VGL2 described above with reference to FIG. 10B, and the second low voltage connection line VGL2_C may be included in the second connection line CNL2 described above with reference to FIG. 10B.

A 1-1-th control signal line S1-1 may extend in the second direction DR2 between a 19-th pixel column COL19 and a 20-th pixel column COL20. The 1-1-th control signal line S1-1 may be connected to an external device. A 1-2-th control signal line S1-2 may extend in the second direction DR2 between the eighth pixel column COL8 and the ninth pixel column COL9. The 1-1-th control signal line S1-1 and the 1-2-th control signal line S1-2 may be connected to each other through a first control signal connection line S1_C extending in the first direction DR1 between a 14-th pixel row ROW14 and a 15-th pixel row ROW15. The 1-1-th control signal line S1-1 and the 1-2-th control signal line S1-2 may form the first control signal line S1 described above with reference to FIG. 8C.

A 2-1-th control signal line S2-1 may extend in the second direction DR2 between a 20-th pixel column COL20 and a 21-th pixel column COL21. The 2-1-th control signal line S2-1 may be connected to an external device. A 2-2-th control signal line S2-2 may extend in the second direction DR2 between the eighth pixel column COL8 and the ninth pixel column COL9. The 2-1-th control signal line S2-1 and the 2-2-th control signal line S2-2 may be connected to each other through a second control signal connection line S2_C extending in the first direction DR1 between the 14-th pixel row ROW14 and the 15-th pixel row ROW15. The 2-1-th control signal line S2-1 and the 2-2-th control signal line S2-2 may form the second control signal line S2 described above with reference to FIG. 8C.

As described above, the control lines (e.g., the 1-1-th low voltage line VGL1-1, etc.) connected to an external device may be disposed outside the first sub-block BLK_S1 to be spaced apart from each other with at least one pixel PXL interposed therebetween. Furthermore, the control lines (e.g., the 1-1-th low voltage line VGL1-1, etc.) connected to an external device may be connected to control lines (e.g. the 1-2-th low voltage line VGL1-2, etc.) in the first sub-block BLK_S1 through connection lines (e.g. the first low voltage connection line VGL1_C, etc.). Meanwhile, the control lines (e.g. the first and fifth scan clock lines SC_CLK1 and SC_CLK5, the first and fifth carry clock lines CR_CLK1 and CR_CLK5) configured to transmit complementary signals may be arranged in pairs.

Figure 12:
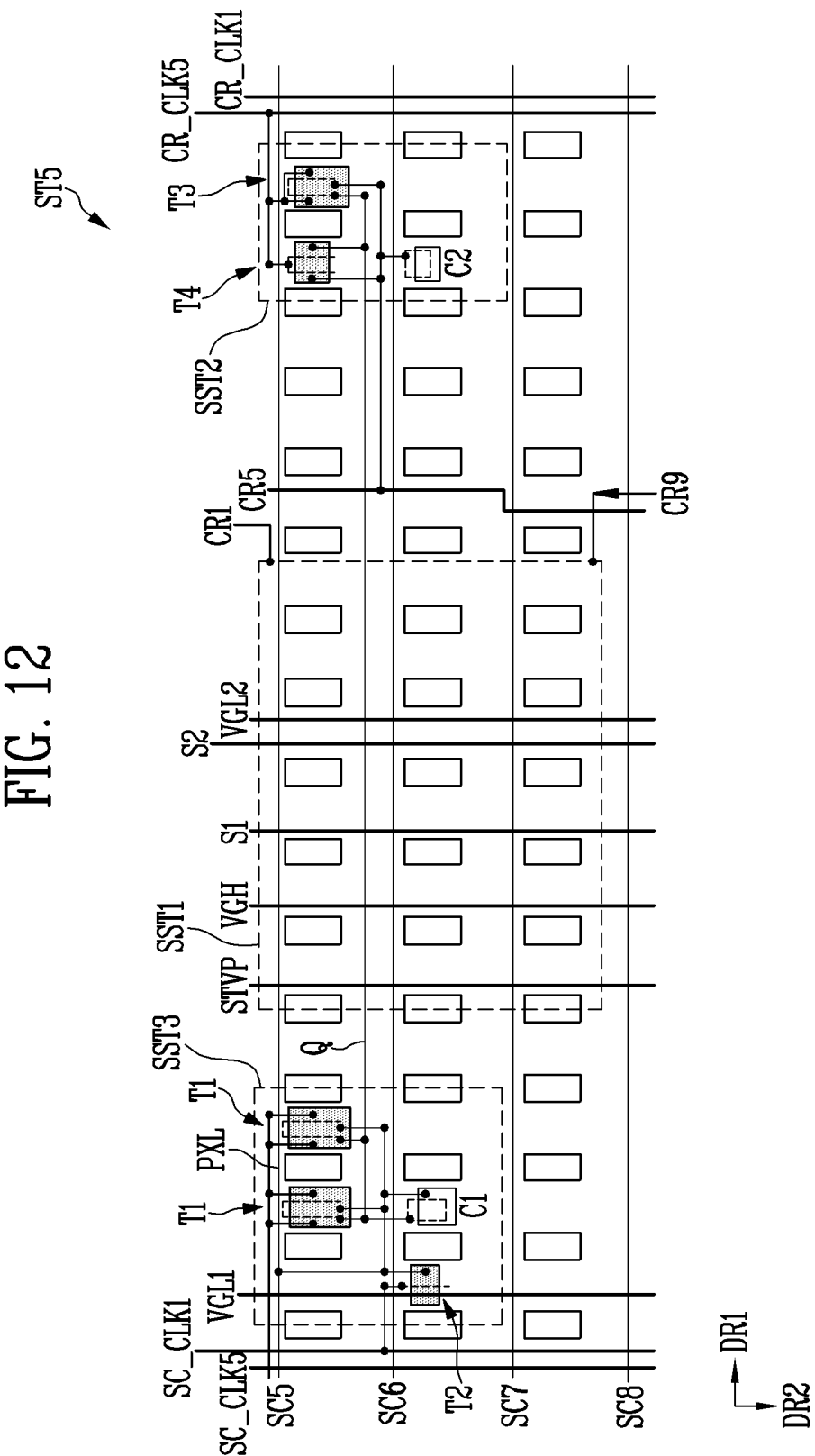
FIG. 12 is a diagram illustrating an example of a stage included in the display panel of FIG. 9.

FIG. 12 is a diagram illustrating an example of a stage included in the display panel of FIG. 9. Because the stages ST1 to STn shown in FIG. 9 are the same or substantially the same as (or similar to) each other, except for their arrangement positions, the fifth stage ST5 will be described in more detail hereinafter, and redundant description with respect to the other stages may not be repeated.

Referring to FIGS. 6, 8A, 8B, and 9 to 12, the fifth stage ST5 may be distributedly disposed at (e.g., in or on) a unit area UA where the fifth to eighth scan lines SC5 to SC8 traverse (e.g., extend across).

The fifth scan clock line SC_CLK5 may be disposed adjacent to one side of the fifth stage ST5 (or adjacent to one side of the unit area UA), along with the first scan clock line SC_CLK1. The fifth carry clock line CR_CLK5 may be disposed adjacent to another side of the fifth stage ST5 (or adjacent to another side of the unit area UA), along with the first carry clock line CR_CLK1. As described above with reference to FIG. 11, the high voltage line VGH, the first low voltage line VGL1, and the second low voltage line VGL2 may be disposed at (e.g., in or on) an inner side of the unit area UA when compared to the first and fifth scan clock lines SC_CLK1 and SC_CLK5 and the first and fifth carry clock lines CR_CLK1 and CR_CLK5, and may be disposed across (e.g., to extend across) the fifth stage ST5 (or the unit area UA), for example. The other control lines (e.g. the start signal line STVP, the first control signal line S1, and the second control signal line S2 extending in the second direction DR2) for controlling the node voltage of the first node Q of the fifth stage ST5 may also be disposed across (e.g., to extend across) the fifth stage ST5. The high voltage line VGH, the first low voltage line VGL1, the second low voltage line VGL2, the start signal line STVP, the first control signal line S1, and the second control signal line S2 may be disposed to be spaced apart from each other with at least one pixel PXL interposed therebetween. However, the present disclosure is not limited thereto.

With respect to the fifth scan clock line SC_CLK5, the second output circuit SST3 may be disposed adjacent to one side thereof at (e.g., in or on) the unit area UA. With respect to the fifth carry clock line CR_CLK5, the first output circuit SST2 may be disposed adjacent to another side thereof at (e.g., in or on) the unit area UA. The node control circuit SST1 may be located between the first output circuit SST2 and the second output circuit SST3 at (e.g., in or on) the unit area UA.

As illustrated in FIG. 12, the first transistor T1 and the first capacitor C1 of the second output circuit SST3 may be distributedly disposed at (e.g., in or on) regions corresponding to two pixels PXL. In consideration of a load of the fifth scan line SC5, the first transistor T1 may include a plurality of sub-transistors that are connected in parallel. The plurality of sub-transistors may be disposed between different pixels PXL.

Each of the sub-transistors may include a semiconductor layer, a gate electrode overlapping with the semiconductor layer, and first and second electrodes (or source/drain electrodes). In FIG. 12, the gate electrodes of the sub-transistors are shown by dotted lines, and the source/drain electrodes are shown by solid lines.

As described above with reference to FIGS. 8A and 8B, the gate electrode of each of the sub-transistors may be connected to a first line forming the first node Q, a first electrode of each of the sub-transistors may be connected to the fifth scan clock line SC_CLK5, and a second electrode of each of the sub-transistors may be connected to the fifth scan line SC5.

In order to secure more sufficient capacitance, the first capacitor C1 may include capacitor electrodes that are disposed on a layer (e.g., the same layer as that of the gate electrode GE described above with reference to FIG. 5) on which the gate electrode of the first transistor T1 is formed, a layer (e.g., the same layer as those of the source and drain electrodes SE and DE described above with reference to FIG. 5) on which the first and second electrodes are formed, and/or a layer (e.g., the same layer as that of the bridge pattern BRP described above with reference to FIG. 5) on which the fifth scan clock line SC_CLK5 is disposed.

The third transistor T3 of the first output circuit SST2 may be disposed between two pixels PXL. As described above with reference to FIG. 8B, the gate electrode of the third transistor T3 may be connected to the first line forming the first node Q, the first electrode of the third transistor T3 may be connected to the fifth carry clock line CR_CLK5, and the second electrode of the third transistor T3 may be connected to the fifth carry line CR5. Similarly, the fourth transistor T4 of the first output circuit SST2 may be disposed between two pixels PXL. As described above with reference to FIG. 8B, the gate electrode of the fourth transistor T4 may be connected to the fifth carry clock line CR_CLK5, the second electrode of the fourth transistor T4 may be connected to the first line forming the first node Q, and the first electrode of the fourth transistor T4 may be connected to the fifth carry line CR5.

The second capacitor C2 may include capacitor electrodes that are disposed, respectively, on a layer (e.g., the same layer as that of the gate electrode GE described above with reference to FIG. 5) on which the gate electrode of the third transistor T3 is formed, and a layer (e.g., the same layer as those of the source and drain electrodes SE and DE described above with reference to FIG. 5) on which the first and second electrodes are formed.

The fifth carry line CR5 may extend in the second direction DR2 between the node control circuit SST1 and the first output circuit SST2. With respect to the fifth carry line CR5, a first carry line CR1 to which a preceding carry signal (e.g. a first carry signal) is applied, and a ninth carry line CR9 to which a subsequent carry signal (e.g. a ninth carry signal) is applied, may be disposed adjacent to the fifth carry line CR5.

As described above, the stage may be distributedly disposed between the pixels PXL at (e.g., in or on) the unit area UA. Furthermore, in order to minimize or reduce the number of lines traversing between the node control circuit SST1, the first output circuit SST2, and the second output circuit SST3 in the stage, the second output circuit SST3 may be disposed at (e.g., in or on) one side of the stage, the first output circuit SST2 may be disposed at (e.g., in or on) another side of the stage, and the node control circuit SST1 may be disposed between the first output circuit SST2 and the second output circuit SST3.

Figure 13:
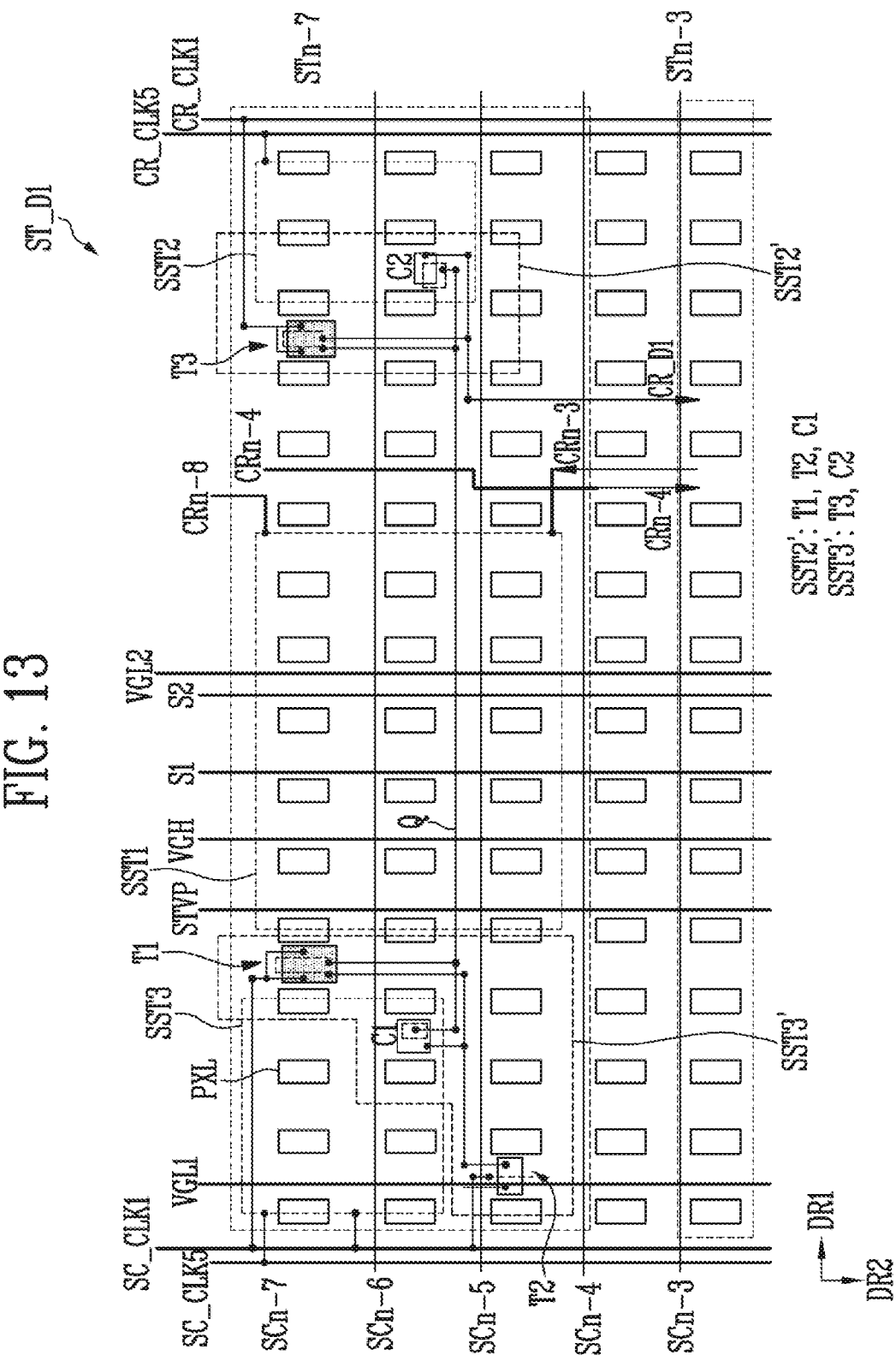
FIG. 13 is a diagram illustrating an example of a stage included in the display panel of FIG. 9.

FIG. 13 is a diagram illustrating an example of a stage included in the display panel of FIG. 9. Because the dummy stages ST_D1 to ST_D4 shown in FIG. 9 are the same or substantially the same as (or similar to) each other, except for their arrangement positions, the first dummy stage ST_D1 will be described in more detail hereinafter, and redundant description with respect to the other dummy stages may not be repeated. FIG. 13 illustrates the n−7-th stage STn−7 and the n−3-th stage STn−3 with respect to the first dummy stage ST_D1. Furthermore, because the circuit configuration of the n−3-th stage STn−3 may be the same or substantially the same as (or similar to) the circuit configuration of the n−7-th stage STn−7, the circuit configuration of the n−7-th stage STn−7 may be described in more detail hereinafter, and redundant description with respect to the n−3-th stage STn−3 may not be repeated.

Referring to FIGS. 6, and 9 to 13, the first dummy stage ST_D1 may be disposed between the n−7-th stage STn−7 and the n−3-th stage STn−3.

The n−7-th stage STn−7 may be distributedly disposed at (e.g., in or on) a unit area UA where the n−7-th to n−4-th scan lines SCn−7 to SCn−4 traverse (e.g., extend across). The n−3-th stage STn−3 may be distributedly disposed at (e.g., in or on) a unit area UA where the n−3-th scan line SCn−3 (e.g., to the n-th scan line) traverses (e.g., extends across). Because the n−7-th stage STn−7 (and the n−3-th stage STn−3) is the same or substantially the same as (or similar to) the fifth stage ST5 described above with reference to FIG. 12, redundant description thereof may not be repeated. The n−7-th stage STn−7 may be connected to the first scan clock line SC_CLK1 and the first carry clock line CR_CLK1.

The first dummy stage ST_D1 may be distributedly disposed between the n−7-th stage STn−7 and the n−3-th stage STn−3. However, the present disclosure is not limited thereto, and the first dummy stage ST_D1 may be disposed at (e.g., in or on) a region corresponding to the n−4-th scan line SCn−4.

Similar to the n−7-th stage STn−7, the first dummy stage ST_D1 may include a dummy node control circuit, a first dummy output circuit SST2', and a second dummy output circuit SST3'. In an embodiment, the second dummy output circuit SST3' may be omitted.

The second dummy output circuit SST3' may be disposed adjacent to one side of the first dummy stage ST_D1, the first dummy output circuit SST2' may be disposed adjacent to another side of the first dummy stage ST_D1, and the dummy node control circuit may be disposed between the first dummy output circuit SST2' and the second dummy output circuit SST3'.

Similar to the second output circuit SST3, the second dummy output circuit SST3' may include a first transistor T1, a second transistor T2, and a first capacitor C1, which are distributedly disposed between the pixels PXL. The first transistor T1 may be disposed between the n−7-th scan line SCn−7 and the n−6-th scan line SCn−6, and may also be disposed between the second output circuit SST3 and the node control circuit SST1 of the n−7-th stage STn−7. The second transistor T2 may be disposed between the n−5-th scan line SCn−5 and the n−4-th scan line SCn−4, and may be disposed adjacent to the first scan clock line SC_CLK1. The first capacitor C1 may be disposed between the first transistor T1 and the second transistor T2. Because the second dummy output circuit SST3' does not output a scan signal, the first transistor T1 of the second dummy output circuit SST3' may not be connected to the scan line. In an embodiment, the first transistor T1 of the second dummy output circuit SST3' may be formed to have a smaller size (or a smaller channel size) than that of the second output circuit SST3.

Similar to the first output circuit SST2, the first dummy output circuit SST2' may include a third transistor T3 and a second capacitor C2 disposed between pixels PXL. The gate electrode of the third transistor T3 may be connected to the first line forming the first node Q of the first dummy stage ST_D1, the first electrode of the third transistor T3 may be connected to the first carry clock line CR_CLK1, and the second electrode of the third transistor T3 may be connected to the first dummy carry line CR_D1. The third transistor T3 may be disposed between the n−7-th scan line SCn−7 and the n−6-th scan line SCn−6, and may also be disposed between the first output circuit SST2 and the node control circuit SST1 of the n−7-th stage STn−7. The second capacitor C2 may be disposed between the n−6-th scan line SCn−6 and the n−5-th scan line SCn−5.

The first dummy carry line CR_D1 may extend in the second direction DR2, and may transmit a first dummy carry signal to the n−3-th stage STn−3.

The dummy node control circuit may receive the n−3-th carry signal through a line branching from the n−3-th carry line CRn−3 extending from the n−3-th stage STn−3 to the n−7-th stage STn−7 in the second direction DR2, and may control the node voltage of the first node Q of the first dummy stage ST_D1 based on the n−3-th carry signal.

As described above, the dummy stage may be disposed between the last two stages (or the last two stages of a corresponding sub-block). Therefore, a separate space (e.g. a non-display area) for arranging the dummy stage may not be used, and the non-display area outside the display area DA (e.g., see FIG. 1) may be minimized or reduced.

Figure 14:
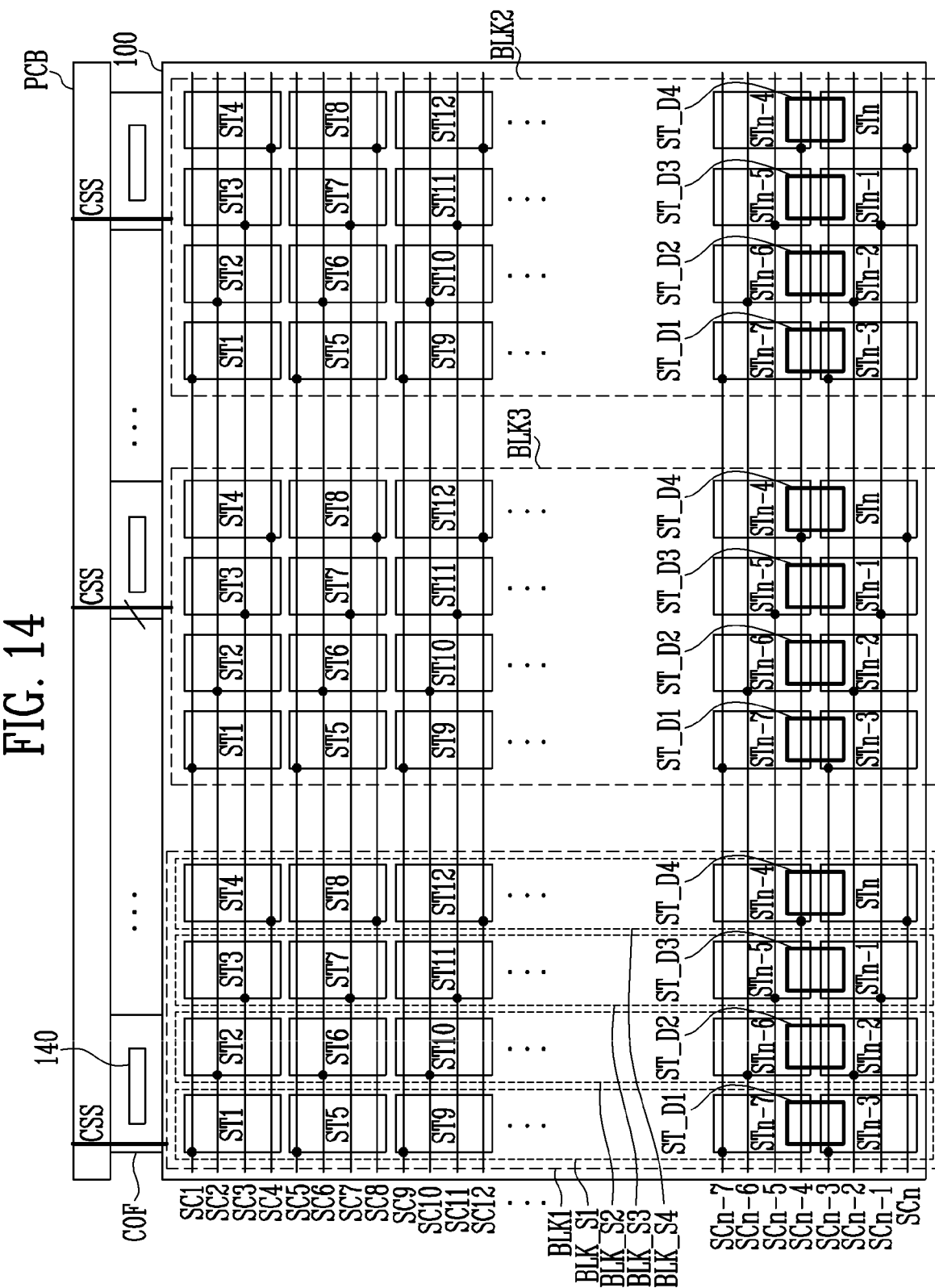
FIG. 14 is a diagram illustrating an example of a display panel included in the display device of FIG. 1.

FIG. 14 is a diagram illustrating an example of a display panel included in the display device of FIG. 1. FIG. 14 is a diagram corresponding to that of FIG. 9.

Referring to FIGS. 9 and 14, the gate driving circuit 120 may further include a third block BLK3, in addition to a first block BLK1 and a second block BLK2.

Similar to the first block BLK1 and the second block BLK2, the third block BLK3 may be connected to scan lines SC1 to SCn included in the display panel 100, and may supply scan signals to the scan lines SC1 to SCn.

The third block BLK3 may include the stages ST1 to STn and the dummy stages ST_D1 to ST_D4 described above with reference to FIG. 6. Because the arrangement and coupling relationship of the stages ST1 to STn and the dummy stages ST_D1 to ST_D4 in the third block BLK3 are the same or substantially the same as (or similar to) the arrangement and coupling relationship of the stages ST1 to STn and the dummy stages ST_D1 to ST_D4 in the first block BLK1 described above with reference to FIG. 9, redundant description thereof may not be repeated.

For reference, because the size of the first and second blocks BLK1 and BLK2 increases, and the first and second blocks BLK1 and BLK2 are distributedly disposed at (e.g., in or on) the display area DA of the display panel 100, there may be a strong possibility that parasitic capacitance increases or defects occur in relation to other signal lines (e.g. data lines).

Therefore, the gate driving circuit 120 may be provided with the first to third blocks BLK1 to BLK3, and may individually check whether the first to third blocks BLK1 to BLK3 are defective (e.g. whether the scan signals output from a corresponding block are delayed and/or changed in waveform) in the manufacturing process of the display panel 100. From among the first to third blocks BLK1 to BLK3, two blocks BLK1 and BLK2 having no defects may be used to drive the display panel 100. For example, for one block (e.g. the third block BLK3 in which defects have occurred) that is not selected from among the first to third blocks BLK1 to BLK3, the transmission lines in the corresponding connection film COF may be cut or opened.

Although FIG. 14 illustrates that three blocks BLK1 to BLK3 are disposed in the display panel 100, the present disclosure is not limited thereto. For example, four or more blocks may be disposed in the display panel 100.

A display device in accordance with one or more embodiments of the present disclosure may include a gate driving circuit that is distributedly disposed (e.g., that is distributively disposed) at (e.g., in or on) a display area, and clock lines connected to stages included in the gate driving circuit may be distributedly disposed (e.g., distributively disposed) at (e.g., in or on) the display area and connected to an external device (e.g. a connection film) through first connection lines disposed between the stages. Thus, a separate non-display area for disposing the gate driving circuit may not be used or required, and the non-display area of the display device may be minimized or reduced.

Furthermore, because clock lines to which clock signals having a phase difference of 180 degrees are applied may be arranged in pairs, the effects of the clock lines disposed between pixels on the pixels may be reduced.

Moreover, power supply lines configured to supply power to stages may be distributedly disposed (e.g., distributively disposed) using second connection lines disposed between the stages, and second connection lines to which DC power is applied may shield a first connection line to which a clock signal is applied in an AC form. Therefore, coupling between the first connection line and the pixels may be suppressed or prevented.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device, comprising:
   a substrate comprising a display area;
   pixels at the display area;
   gate lines at the display area, and connected to the pixels;
   carry clock lines and scan clock lines at the display area; and
   a gate driving circuit distributedly located at the display area, and connected to the carry clock lines, the scan clock lines, and the gate lines,
   wherein the gate driving circuit comprises a plurality of stages, each of the stages being configured to output, as a carry signal, a carry clock signal supplied through a corresponding carry clock line from among the carry clock lines in response to a preceding carry signal supplied from a preceding stage, and to output to a corresponding gate line from among the gate lines, as a scan signal, a scan clock signal supplied through a corresponding scan clock line from among the scan clock lines, and
   wherein the corresponding carry clock line and the corresponding scan clock line corresponding to one stage from among the stages are spaced from each other with at least one of the pixels interposed therebetween.

2. The display device according to claim 1, wherein:
   the corresponding scan clock line is located at a first side of the one stage, and
   the corresponding carry clock line is located at a second side opposite the first side of the one stage.

3. The display device according to claim 2, wherein the one stage comprises a plurality of transistors, and the transistors are distributedly located at a unit area corresponding to at least two gate lines from among the gate lines.

4. The display device according to claim 2, wherein:
   the corresponding carry clock line is adjacent to a preceding carry clock line from among the carry clock lines between the stages, and a preceding carry clock signal having a phase difference of 180 degrees from the carry clock signal is applied to the preceding carry clock line, and
   the corresponding scan clock line is adjacent to a preceding scan clock line from among the scan clock lines between the stages, and a preceding scan clock signal having a phase difference of 180 degrees from the scan clock signal is applied to the preceding scan clock line.

5. The display device according to claim 4, wherein the one stage comprises:
   a node control circuit configured to control a first node voltage of a first node in response to the preceding carry signal;

a first output circuit configured to output, as the carry signal, the carry clock signal in response to the first node voltage; and a second output circuit configured to output, as the scan signal, the scan clock signal in response to the first node voltage, wherein the first output circuit is adjacent to the first side of the one stage, wherein the second output circuit is adjacent to the second side of the one stage, and wherein the node control circuit is between the first output circuit and the second output circuit.

6. The display device according to claim 5, further comprising:

a first power supply line at the display area, and connected to the first output circuit; and a second power supply line at the display area, and connected to the second output circuit, wherein the first power supply line and the second power supply line are located between the corresponding carry clock line and the corresponding scan clock line with respect to the one stage.

7. The display device according to claim 1, wherein:

the gate driving circuit further comprises a dummy stage;

each of the stages is configured to be initialized in response to a subsequent carry signal supplied from a subsequent stage, and the subsequent stage is configured to shift the carry signal to output the subsequent carry signal;

a last stage from among the stages is configured to receive the subsequent carry signal from the dummy stage; and the dummy stage is spaced farther from an edge of the display area compared to the last stage.

8. The display device according to claim 7, wherein the dummy stage is located between last two stages from among the stages.

9. The display device according to claim 1, wherein:

the gate lines extend in a first direction;

the carry clock lines and the scan clock lines extend in a second direction; and the gate lines cross the carry clock lines and the scan clock lines at the display area.

10. The display device according to claim 9, wherein:

the stages are divided into sub-blocks along the first direction with respect to the carry clock lines; and a part of the stages is located along the first direction.

11. The display device according to claim 10, wherein:

two carry clock lines to which two carry clock signals having a phase difference of 180 degrees are applied from among the carry clock lines are arranged in a pair, and stages that are connected to the pair of carry clock lines from among the stages are included in one sub-block.

12. The display device according to claim 11, wherein at least a part of the carry clock lines is connected to first connection lines extending in the first direction between the stages.

13. The display device according to claim 12, further comprising power supply lines at the display area, and connected to the stages, wherein the power supply lines are located between the carry clock lines and the scan clock lines with respect to each of the stages, wherein the power supply lines are connected to second connection lines extending in the first direction between the stages, and wherein each of the second connection lines is more adjacent to the pixels compared to the first connection lines.

14. The display device according to claim 1, wherein:

the gate driving circuit comprises three or more blocks; and each of the blocks comprises at least two stages from among the plurality of stages.

15. A display device, comprising:

a substrate comprising a display area;

pixels at the display area;

gate lines at the display area, and connected to the pixels;

carry clock lines and scan clock lines at the display area; and a gate driving circuit distributedly located at the display area, and connected to the carry clock lines, the scan clock lines, and the gate lines, wherein the gate driving circuit comprises a plurality of stages, each of the stages being configured to output, as a carry signal, a carry clock signal supplied through a corresponding carry clock line from among the carry clock lines in response to a preceding carry signal supplied from a preceding stage, and to output to a corresponding gate line from among the gate lines, as a scan signal, a scan clock signal supplied through a corresponding scan clock line from among the scan clock lines, wherein the gate driving circuit further comprises a dummy stage, wherein each of the stages is configured to be initialized in response to a subsequent carry signal supplied from a subsequent stage, and the subsequent stage is configured to shift the carry signal to output the subsequent carry signal, wherein a last stage from among the stages is configured to receive the subsequent carry signal from the dummy stage, and wherein the dummy stage is spaced farther from an edge of the display area compared to the last stage.

16. The display device according to claim 15, wherein the dummy stage is located between last two stages from among the stages.

17. The display device according to claim 15, wherein:

the gate lines extend in a first direction, and the carry clock lines and the scan clock lines extend in a second direction;

the gate lines cross the carry clock lines and the scan clock lines at the display area; and a part of the stages is located along the first direction.

18. The display device according to claim 17, wherein two carry clock lines to which two carry clock signals having a phase difference of 180 degrees are applied from among the carry clock lines form a pair, and the pair of carry clock lines are located between two adjacent stages from among the stages.

19. The display device according to claim 17, wherein at least a part of the carry clock lines is connected to first connection lines extending in the first direction between the stages.

20. The display device according to claim 19, further comprising power supply lines at the display area, and connected to the stages, wherein the power supply lines are located between the carry clock lines and the scan clock lines with respect to each of the stages, wherein the power supply lines are connected to second connection lines extending in the first direction between the stages, and wherein each of the second connection lines is more adjacent to the pixels compared to the first connection lines.

\* \* \* \* \*